United States Patent [19]

Deam et al.

[11] Patent Number: 5,172,310
[45] Date of Patent: Dec. 15, 1992

[54] LOW IMPEDANCE BUS FOR POWER ELECTRONICS

[75] Inventors: David Deam, San Ramon; William L. Erdman, Livermore, both of Calif.

[73] Assignee: U.S. Windpower, Inc., Livermore, Calif.

[21] Appl. No.: 728,112

[22] Filed: Jul. 10, 1991

[51] Int. Cl.[5] .......................................... H02M 1/10
[52] U.S. Cl. .................................... 363/144; 363/132; 361/355; 307/148
[58] Field of Search ................. 363/144, 132, 56, 137, 363/141; 361/355, 341, 361; 307/58, 147, 148

[56] References Cited

U.S. PATENT DOCUMENTS

| | | | |
|---|---|---|---|
| 3,895,285 | 7/1975 | Bardahl | 363/144 |
| 4,056,767 | 11/1977 | Tobise et al. | 363/141 |
| 4,224,663 | 9/1980 | Maiese | 363/144 |
| 4,346,257 | 8/1982 | Moss | 361/306 |
| 4,458,305 | 7/1984 | Buckle et al. | 363/141 |
| 4,703,189 | 10/1987 | DiValentin et al. | 290/44 |
| 4,891,744 | 1/1990 | Yamamoto et al. | 363/89 |

OTHER PUBLICATIONS

Hinrichsen, E. N., "Variable Rotor Speed for Wind Turbines: Objectives and Issues", AP-4261, Research Project 1996-9, Final Report, Sep. 1985, Research Reports Center, Palo Alto, Calif.

McNerney et al., "The Effect of a Power Electronic Converter on Power Fluctuation and Harmonic Distortion in a WECS," ASME Wind Energy Symposium, New Orleans, Jan. 1990.

Matsuzaka et al., "A Variable Speed Wind Generating System and its Test Results, Hachinohe Institute of Technology", Tohoku Electric Power Company, Japan.

Ott, Henry W., "Noise Reduction Techniques in Electronic Systems", 2nd Edition, John Wiley & Sons (1988) pp. 124-126.

Smith et al., "A Variable-Speed Constant-Frequency Induction Generator for Sub and Supersynchronous Operation", European Wind Energy Association Conference and Exhibition, Oct. 7-9, 1986, Rome, Italy.

Primary Examiner—Steven L. Stephan
Assistant Examiner—Adolf Berhane
Attorney, Agent, or Firm—Blakely, Sokoloff, Taylor & Zafman

[57] ABSTRACT

A low impedance, high power bus for conduction of electrical power with reduced transient signal effects is described herein. The high power bus can be applied as a high power supply bus between a constant voltage source and a plurality of switching cells positioning at varying locations along the bus, and as branch bus for the switching cells. The power bus can transmit high power: large currents in the hundreds or thousands of amperes, and large voltage potentials in the hundreds or thousands of volts. Particularly, the power bus has use in a DC-to-AC inverter that converts DC from a constant voltage source into three-phase AC for delivery to an electrical power grid. The high power bus includes two conductive bars positioned so that the current flow therethrough is balanced (equal and opposing), and the magnetic field is substantially confined between the bars. The bus includes a dielectric positioned between the conductive bars. In a preferred embodiment, the AC is conducted on extension bars that extend along the power supply bus, so that a main bus is created by the combination of the AC extension bars and the DC power supply bus, and the sum of the currents in the bars is approximately zero at all locations in the bus. The power bus lessens or even obviates the need for the snubber networks commonly used to reduce transients, and reduces the strength of magnetic fields and electric fields that could otherwise interfere with neighboring electrical components.

26 Claims, 13 Drawing Sheets

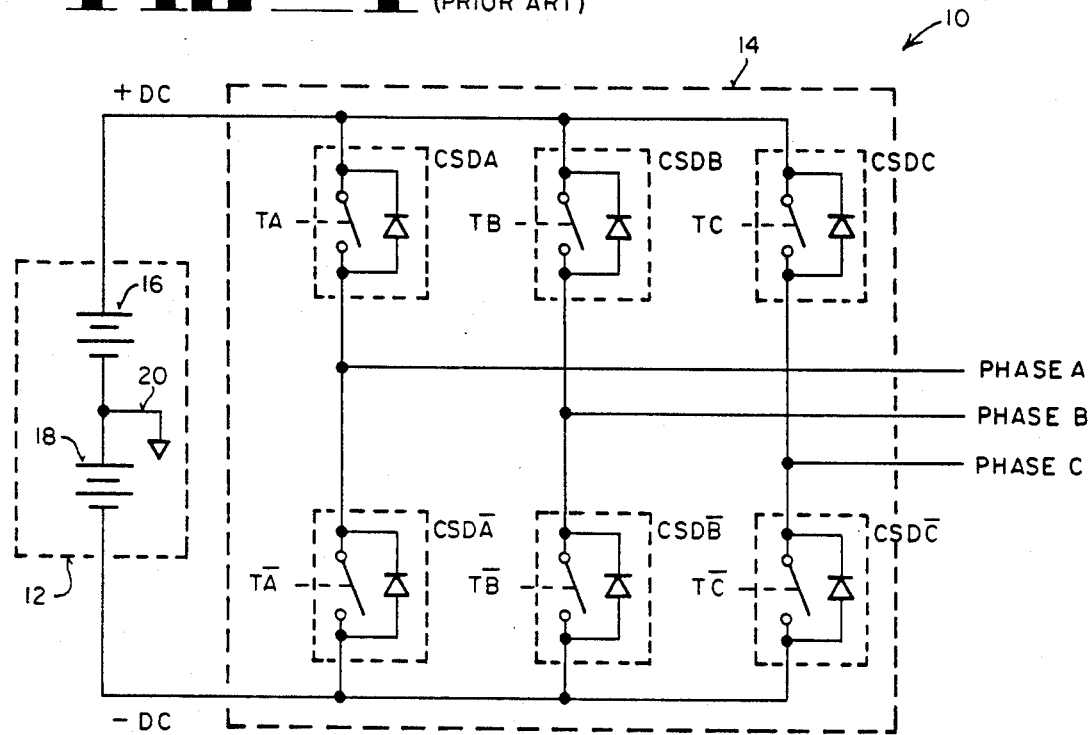
FIG_1 (PRIOR ART)
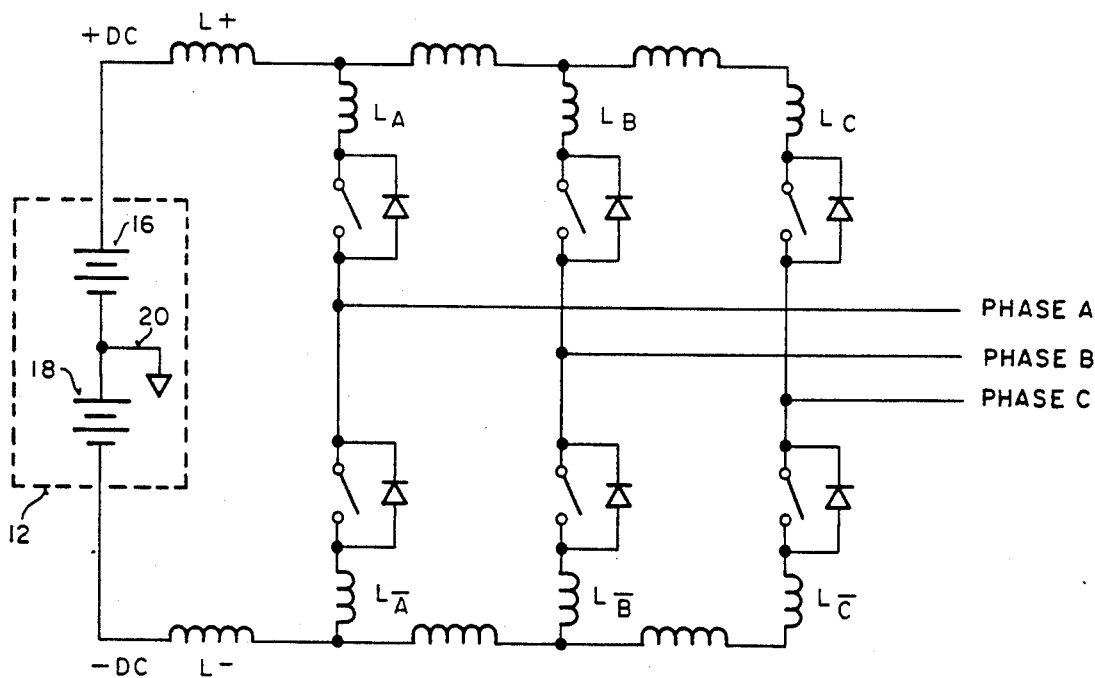
FIG_3

FIG_2 (PRIOR ART)
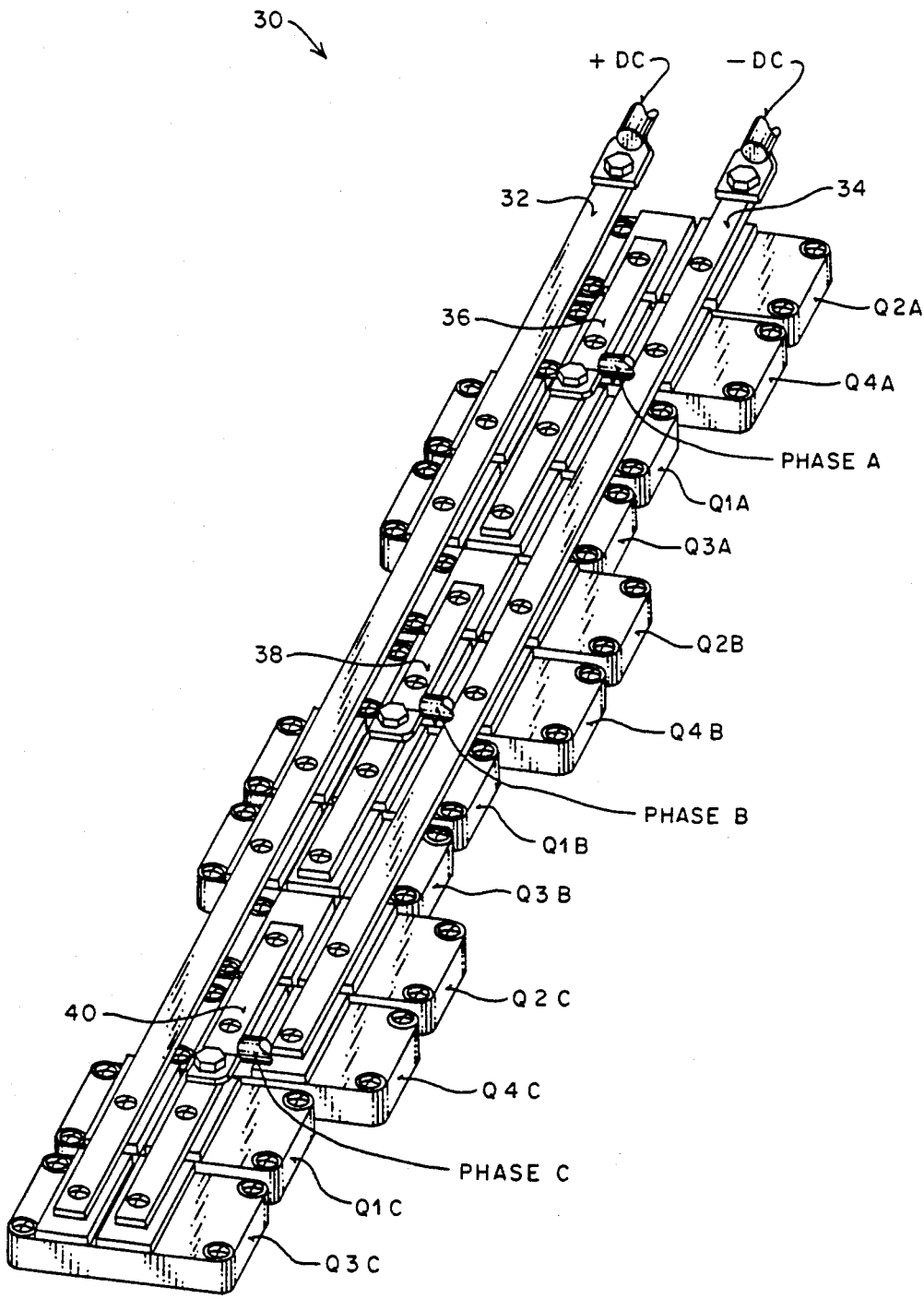

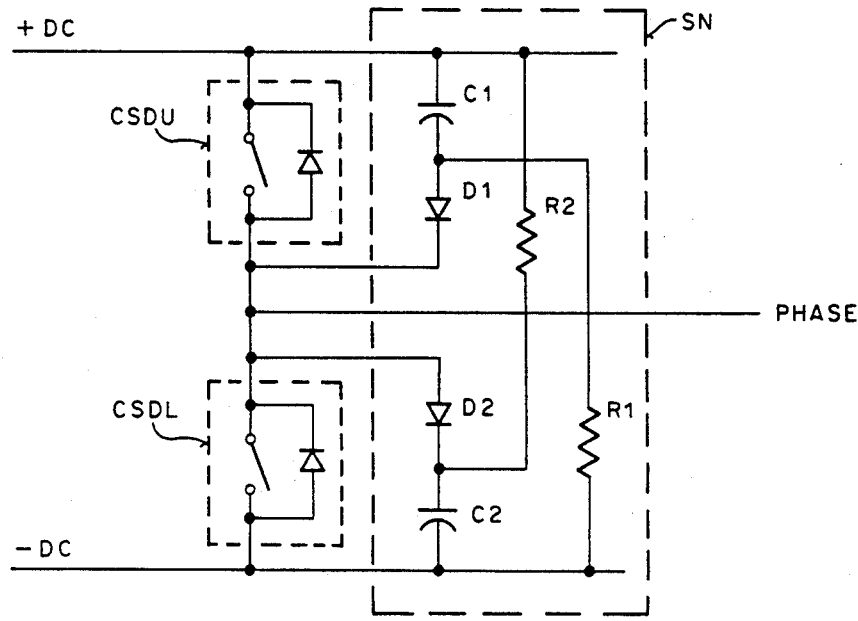
FIG_4 (PRIOR ART)
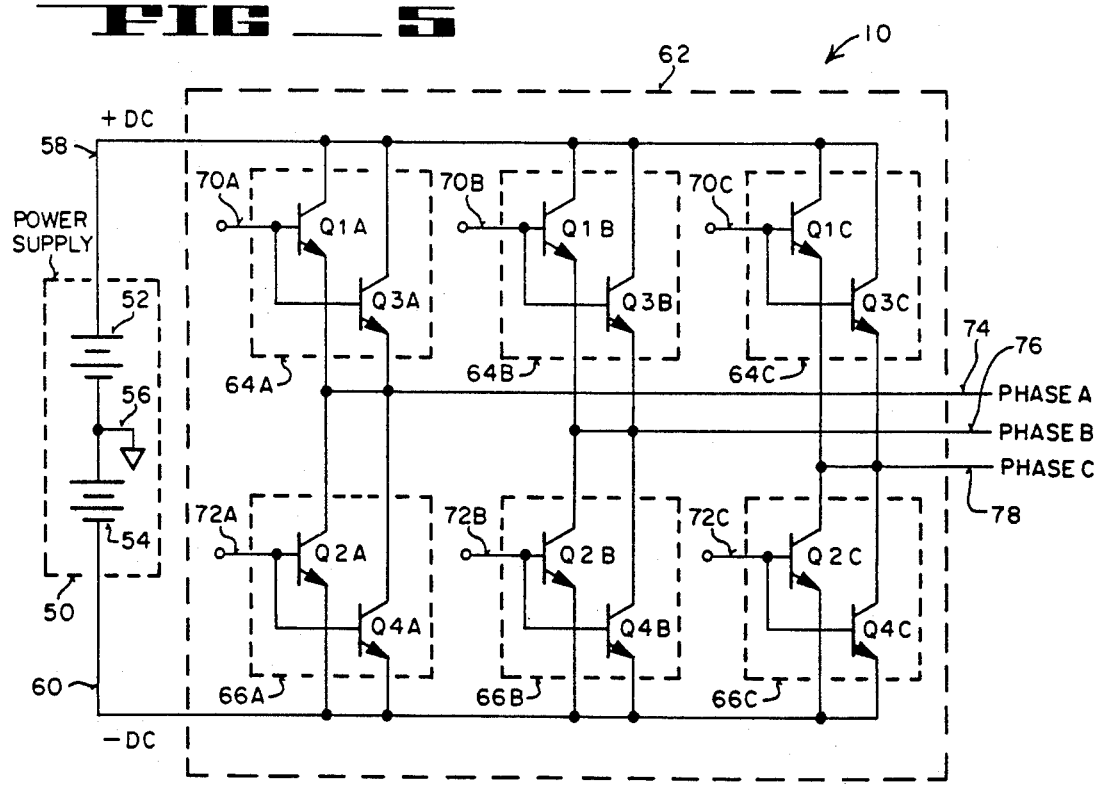
FIG_5

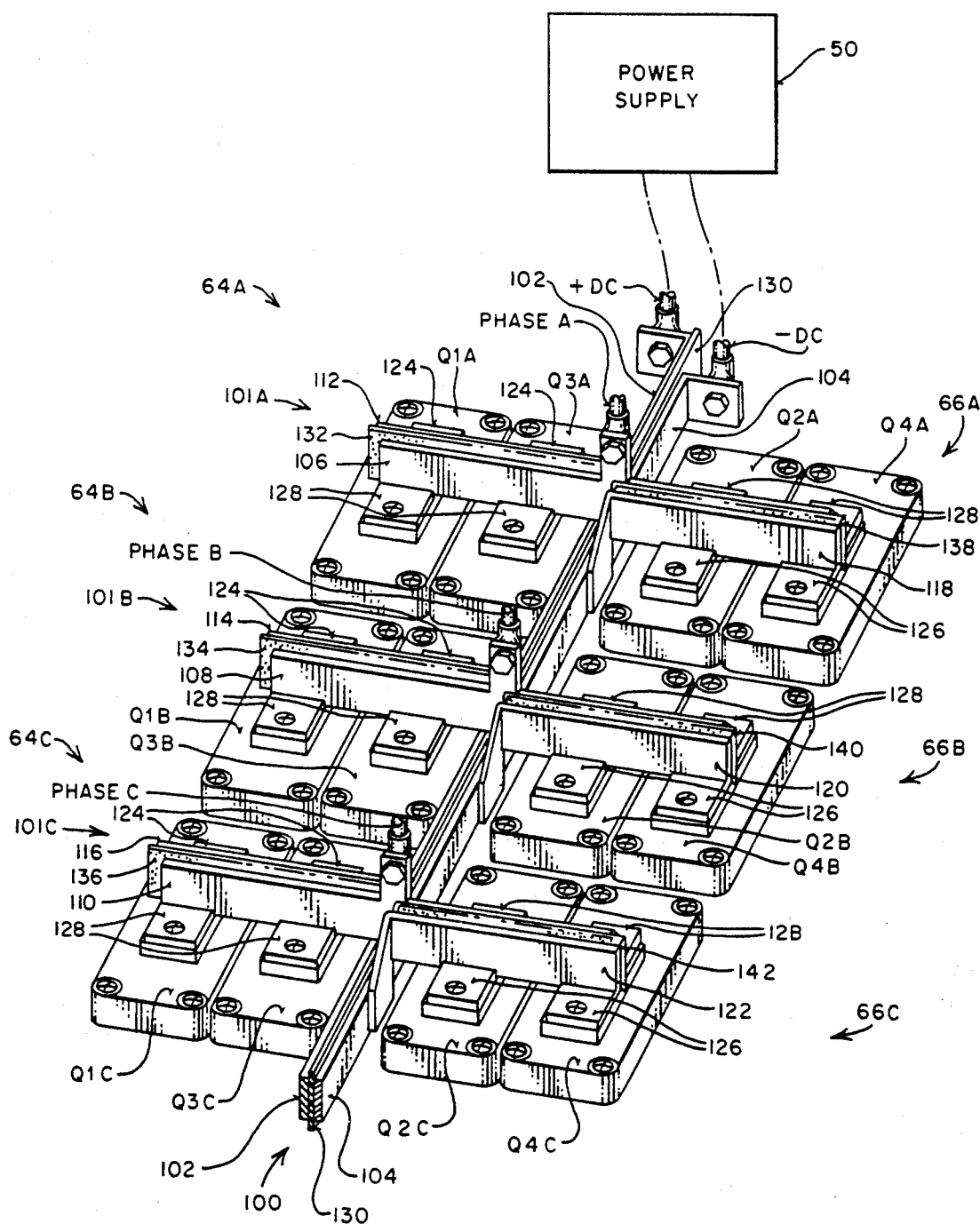
FIG_6

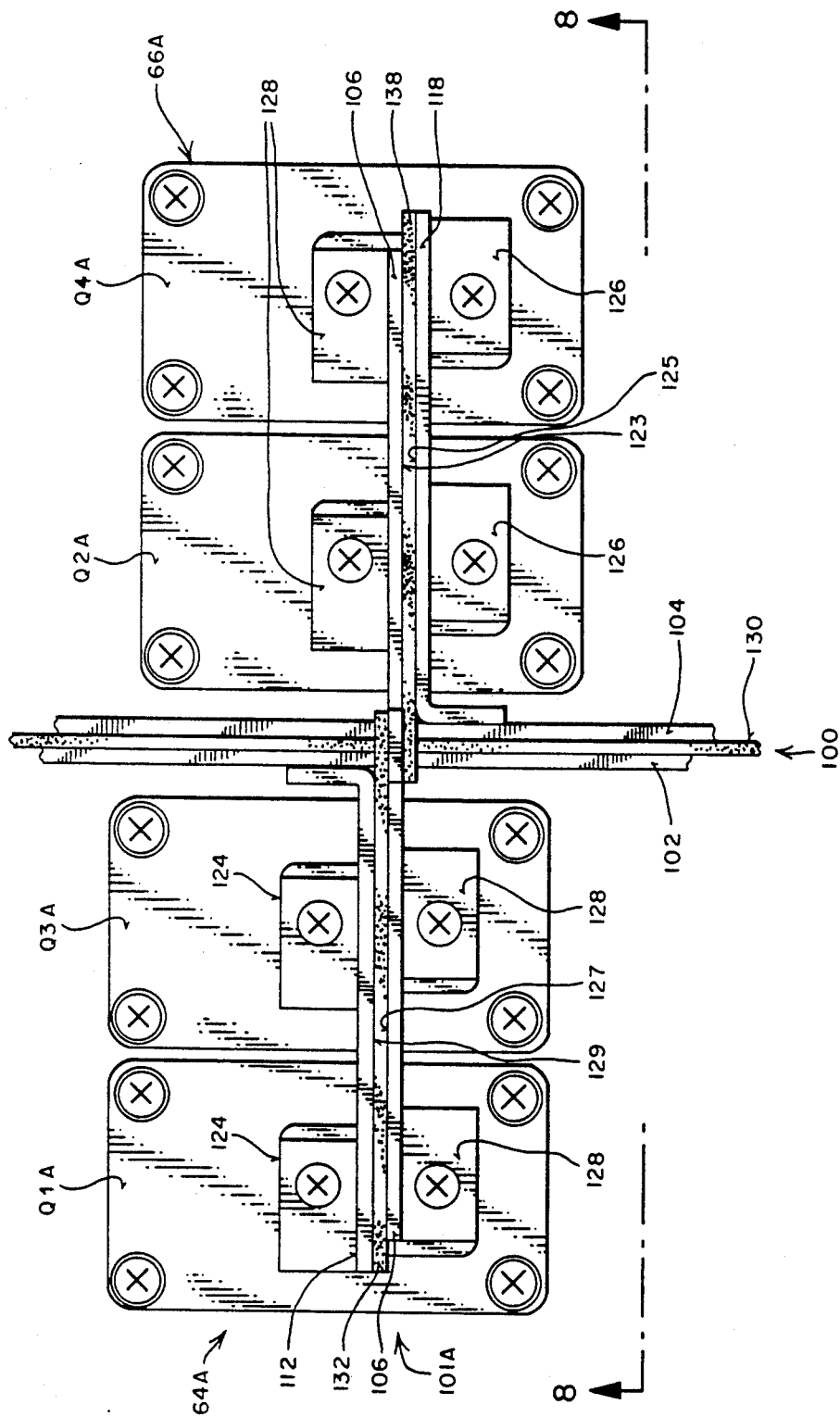

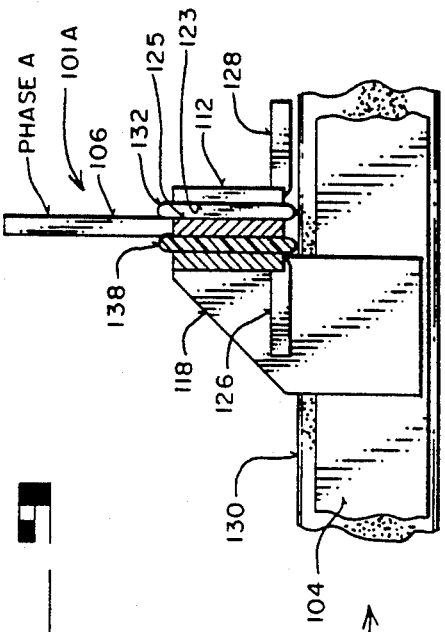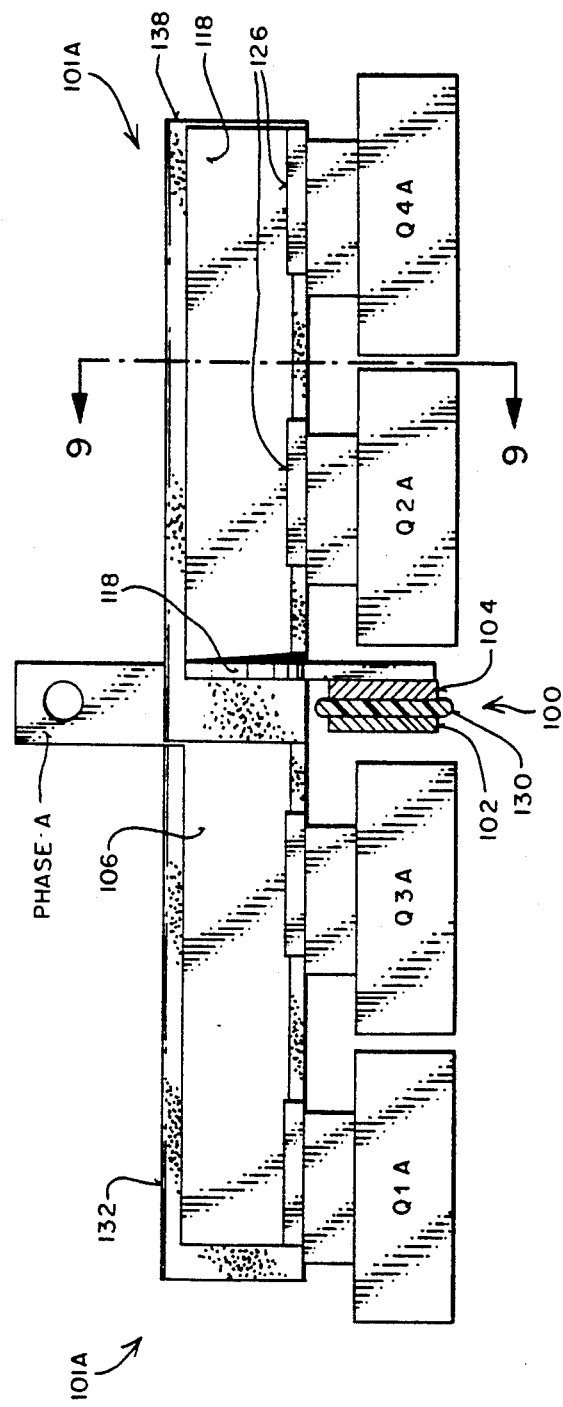

FIG _ 10
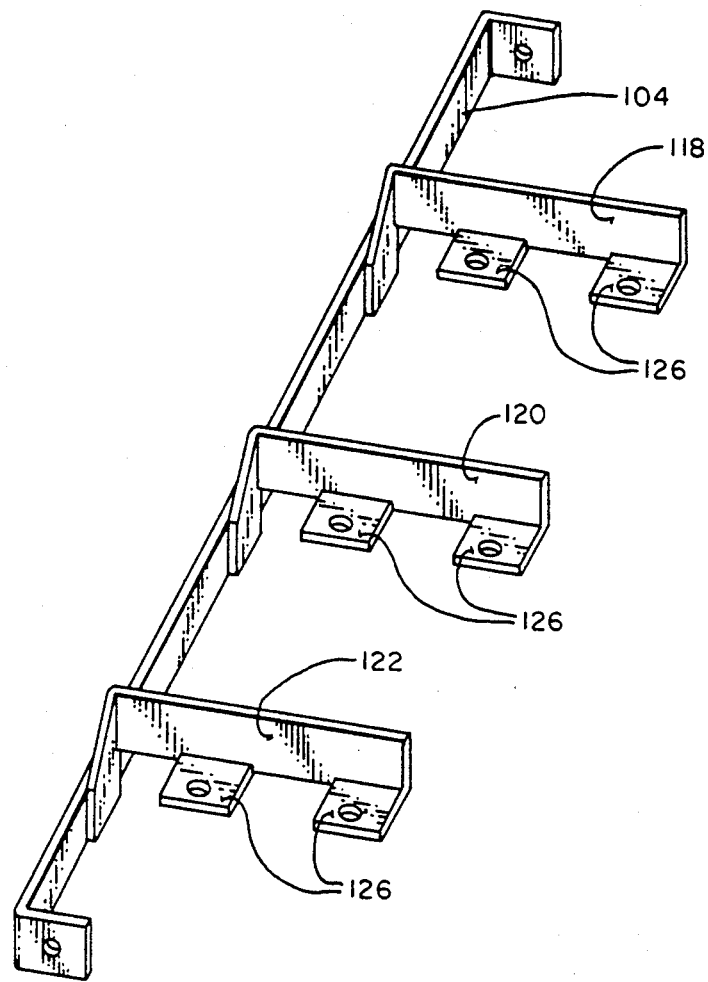
FIG _ 11
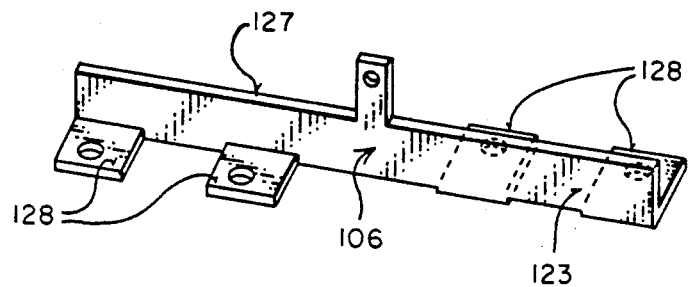

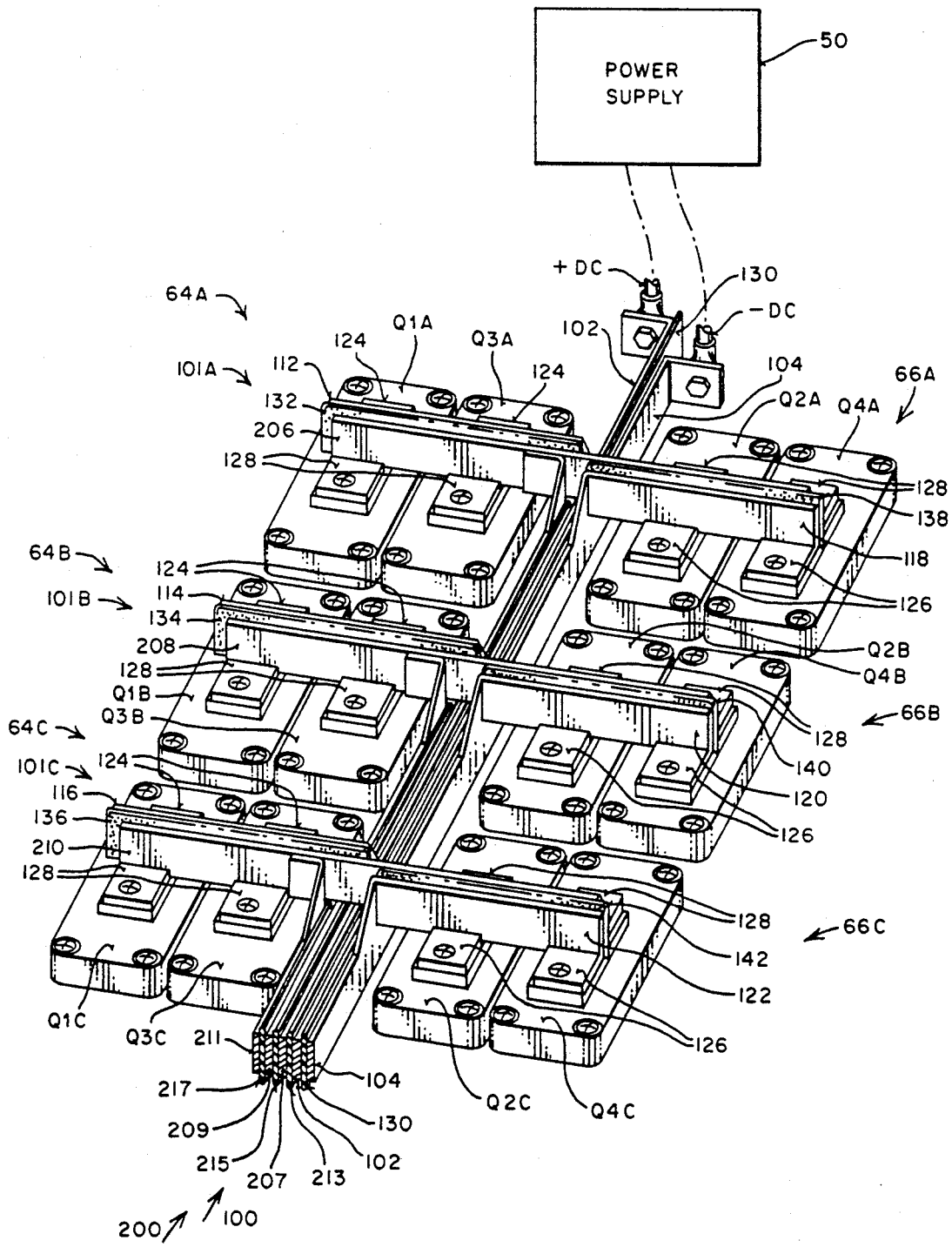
FIG_12

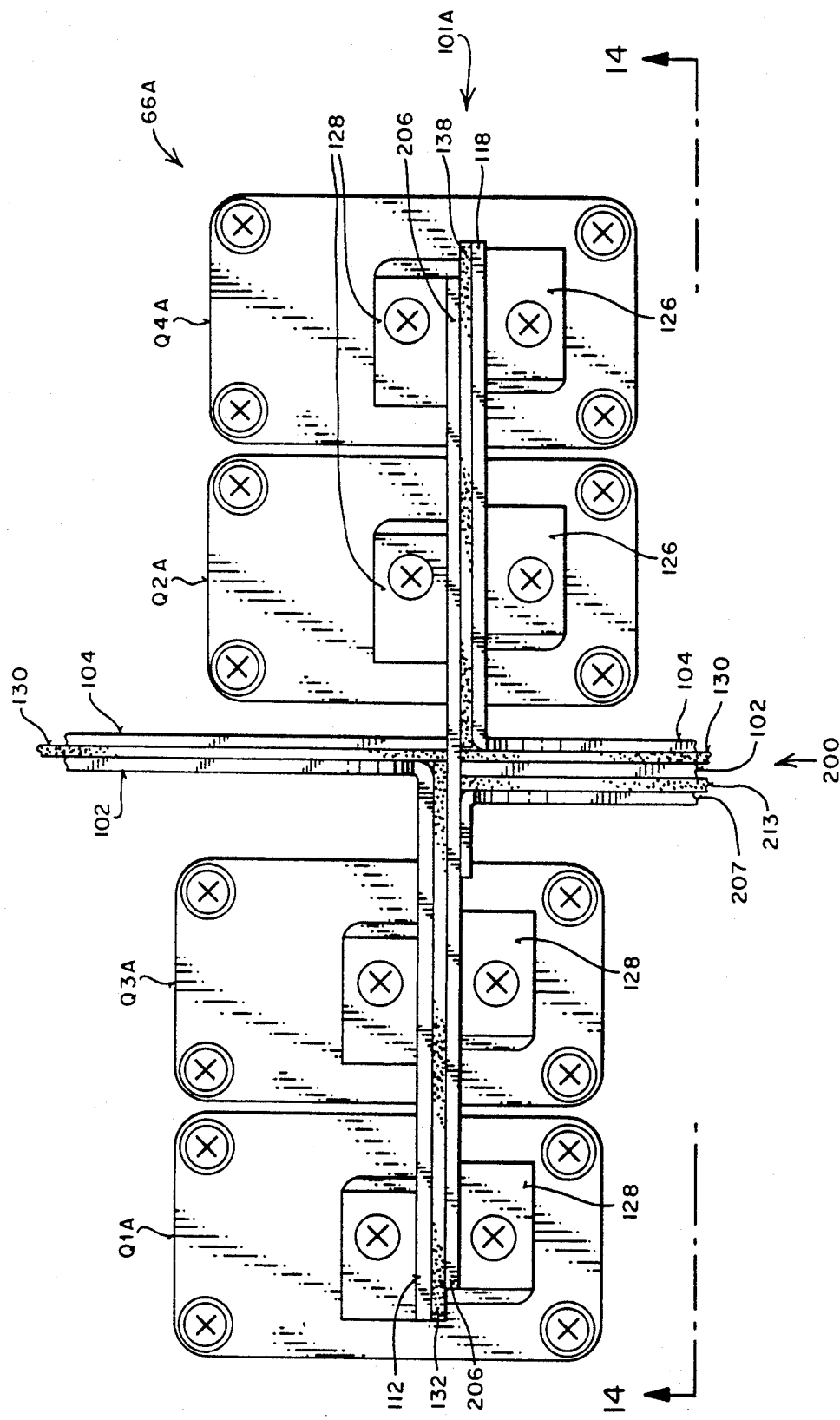
FIG_13

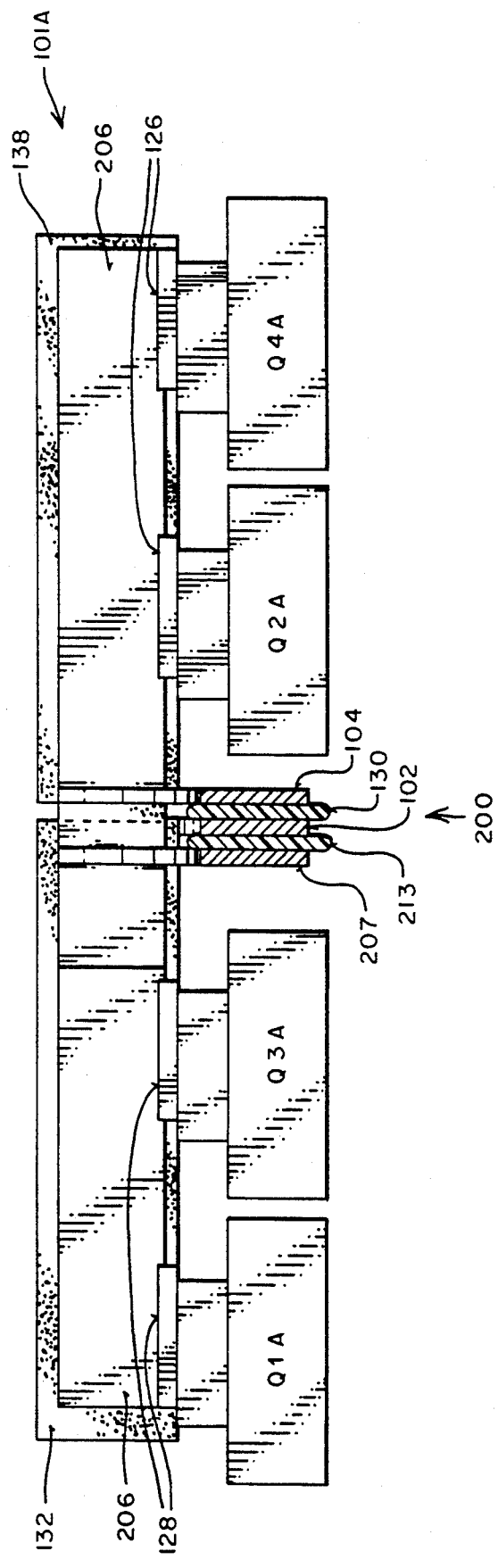
FIG_14

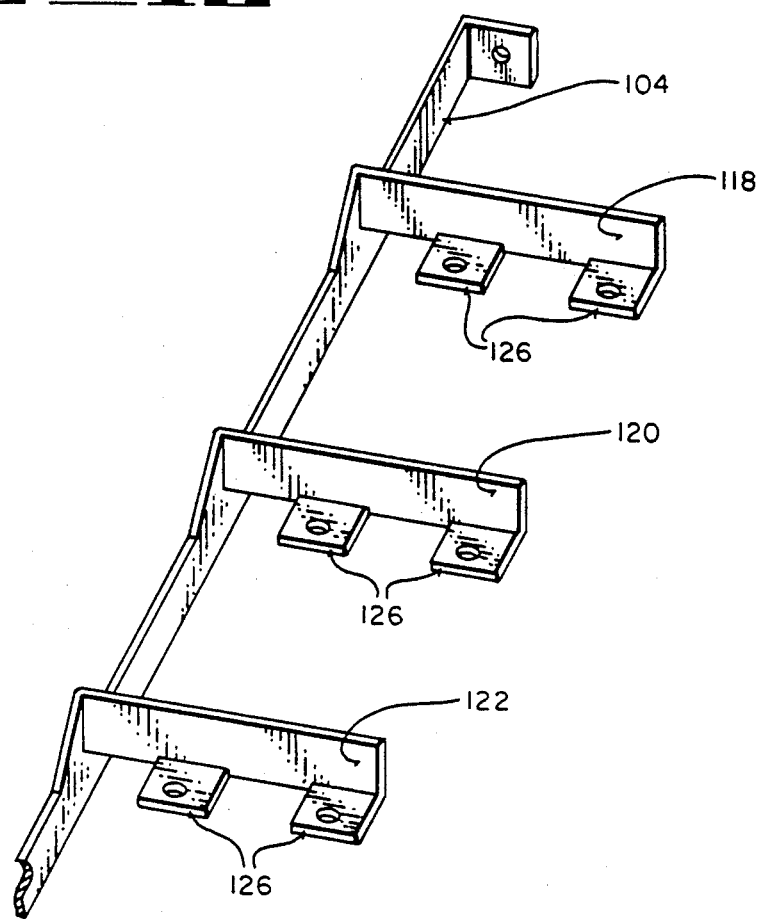
FIG_15
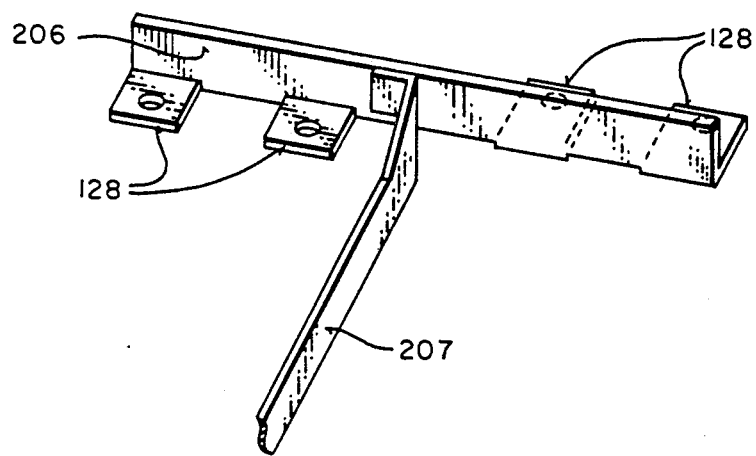
FIG_16

FIG. 18 - TABLE: 1

| Alternative # | I | II | III | IV | V | VI | VII | VIII |
|---|---|---|---|---|---|---|---|---|
| Phase switches 64A/66A | on/off | on/off | on/off | off/on | off/on | off/on | off/on | on/off |
| Phase switches 64B/66B | off/on | on/off | off/on | off/on | on/off | on/off | off/on | on/off |
| Phase switches 64C/66C | off/on | off/on | on/off | on/off | off/on | on/off | off/on | on/off |

Cross-section 320:

| | I | II | III | IV | V | VI | VII | VIII |
|---|---|---|---|---|---|---|---|---|
| i300 (+DC bar section300) | $i_a$ | $i_a + i_b$ | $i_a + i_c$ | $i_c$ | $i_b$ | $i_b + i_c$ | 0 | 0 |
| i306 (-DC bar section 306) | $i_b + i_c$ | $i_c$ | $i_b$ | $i_a + i_b$ | $i_a + i_c$ | $i_a$ | 0 | 0 |
| Total: $i_a + i_b + i_c = 0$ | | | | | | | $i = 0$ | |

Cross-section 322:

| | I | II | III | IV | V | VI | VII | VIII |
|---|---|---|---|---|---|---|---|---|
| i207 (Phase A) | $i_a$ | $i_a$ | $i_a$ | $i_a$ | $i_a$ | $i_a$ | $i_a$ | $i_a$ |
| i302 (+DC bar section 302) | 0 | $i_b$ | $i_c$ | $i_c$ | $i_b$ | $i_b + i_c$ | 0 | $-i_a$ |
| i308 (-DC bar section 308) | $i_b + i_c$ | $i_c$ | $i_b$ | $i_b$ | $i_c$ | 0 | $-i_a$ | 0 |
| Total: $i_a + i_b + i_c = 0$ | | | | | | | $i = i_a - i_a = 0$ | |

Cross-section 324:

| | I | II | III | IV | V | VI | VII | VIII |
|---|---|---|---|---|---|---|---|---|
| i207 (Phase A) | $i_a$ | $i_a$ | $i_a$ | $i_a$ | $i_a$ | $i_a$ | $i_a$ | $i_a$ |
| i209 (Phase B) | $i_b$ | $i_b$ | $i_b$ | $i_b$ | $i_b$ | $i_b$ | $i_b$ | $i_b$ |
| i304 (+DC bar section 304) | 0 | 0 | $i_c$ | $i_c$ | 0 | $i_c$ | 0 | $i_c$ |
| i310 (-DC bar section 310) | $i_c$ | $i_c$ | 0 | 0 | $i_c$ | 0 | $i_c$ | 0 |
| Total: $i_a + i_b + i_c = 0$ | | | | | | | | |

Cross-section 326:

| | I | II | III | IV | V | VI | VII | VIII |
|---|---|---|---|---|---|---|---|---|
| i211 (Phase C) | $i_c$ | $i_c$ | $i_c$ | $i_c$ | $i_c$ | $i_c$ | $i_c$ | $i_c$ |
| i209 (Phase B) | $i_b$ | $i_b$ | $i_b$ | $i_b$ | $i_b$ | $i_b$ | $i_b$ | $i_b$ |
| i207 (Phase A) | $i_a$ | $i_a$ | $i_a$ | $i_a$ | $i_a$ | $i_a$ | $i_a$ | $i_a$ |
| Total: $i_a + i_b + i_c = 0$ | | | | | | | | |

LOW IMPEDANCE BUS FOR POWER ELECTRONICS

BACKGROUND OF THE INVENTION

1. Field of the Invention

The present invention relates to low impedance, low-noise power buses for power electronics applications. Specifically, the present invention relates to power buses for high power switching inverters (DC-to-AC) and converters (DC-to-DC or AC-to-DC), and in particular, to power bus topologies and interconnections for DC-to-AC high power inverters that have a plurality of switching devices and produce three phase AC power.

2. Description of the Related Art

Power electronics is a multi-disciplinary field that deals with electrical power equipment, electronic devices for converting and controlling the electrical power, and circuits for controlling the electronic devices to provide the desired output power. Electrical power equipment may include static and rotating power equipment for the generation, transmission, and distribution of electric power. Electronic devices may include solid-state semiconductor devices. Control issues include the steady-state and dynamical characteristics of closed-loop systems. Power electronics circuits may include circuits that produce DC, AC, or other waveforms to be used as power sources for other electrical components. In general, power electronics circuits process power for delivery to other circuits; by comparison, circuits for signal processing process a signal to provide a desired output. One example of a circuit for signal processing is an integrated circuit.

The field of power electronics includes applications of solid-state electronics for control and conversion of electric power. A circuit that can convert electrical energy from DC (direct current) to AC (alternating current) is termed an inverter. Such an inverter has many uses, including wind turbines, adjustable speed motor drives, uninterruptible power supplies, and variable frequency AC power supplies. For wind turbines that supply electrical energy to a power grid, an efficient DC-to-AC inverter is expected to be very useful in the next generation of wind power devices, particularly those designed for variable speed operation. Also, an efficient AC-to-DC converter will be very useful; many DC-to-AC inverters can be operated in reverse as an AC-to-DC converter. Basic issues in wind turbine generation are conversion efficiency and reliability. For wind turbines, efficiency of the conversion process directly affects the economics and profitability of power generation; a lack of efficiency can undermine the profitability of a wind turbine project. At a very low efficiency, a wind turbine project becomes unprofitable to install and operate. Furthermore, reliability is an important concern for wind turbines deployed in the field; repair costs are expensive and down time can represent a major loss of income while the turbine awaits repair.

Generally speaking, a conventional DC-to-AC inverter employs a number of switching cells, each of which may include one or more semiconductor devices, connected between a DC power supply and an AC power output. The switching cells are switched on and off to create a desired waveform. For example, the switching cells may be selectively turned on and off many times to produce the desired output AC frequency, such as 60 Hz. An inherent problem with switching the cells, particularly for high power uses, is the appearance of large voltage and current transients. The voltage and current transients occur during the semiconductor switching process, and result from stray parasitic inductances, which are discussed in more detail later in the background. Generally, these large transients can cause noise and can interfere with the functioning of low power components nearby, as well as reduce the life of electrical components subject to the transients. In addition, the transients reduce inverter efficiency and require the design to include more expensive components that can withstand the high voltage peaks of the transients. As will be explained later in more detail, additional electrical circuits, such as snubber networks, have been used to reduce the transient's effects.

A conventional DC-to-AC inverter circuit will be described. Referring to FIG. 1, a conventional DC-to-AC power inverter system 10 generally includes a DC power source 12 and a switching matrix 14. The DC power source 12 may have series-connected DC power sources 16,18 providing positive +DC and negative −DC voltages with respect to an isolated ground 20. The switching matrix 14 includes a plurality of current switching cells, each including a semiconductor device. Many different types of semiconductor devices may be used; these include bipolar junction transistors (BJTs), silicon controlled rectifiers (SCRs), gate turn off thyristors (GTOs), insulated gate bipolar transistors (IGBTs), or metal oxide silicon field effect transistors (MOSFETs). The switching cells are connected as shown across the +DC and −DC power lines, and are selectively switched on and off to produce three-phase AC power. As shown in FIG. 1, a total of six switches are used, and therefore a total of six trigger signals provided by a controller (not shown) in a conventional pattern to convert DC power into three-phase, AC power. For purposes of explanation, the six switches can be divided into three pairs; each pair producing one of the three phases. Also for purposes of explanation, DC power is input to the switches, and AC power is output from them. However, the same circuit could easily operate in reverse; i.e., the AC power could be the input, and the DC power could be the output. The switches are typically operated to provide AC (alternating current) at a frequency of 60 Hz, however, the switches may also be operated to provide AC at other frequencies, or even to provide waveforms other than AC.

The first phase, i.e. phase A, is generated using the pair of current switching cells CSDA,$\overline{\text{CSDA}}$. The switch CSDA is connected between the +DC bus and the phase A line, and the switch $\overline{\text{CSDA}}$ is connected between the phase A line and the −DC bus. As is known in the art, by providing appropriate trigger signals TA/$\overline{\text{TA}}$ to the current switching cells CSDA,$\overline{\text{CSDA}}$, an AC voltage is generated at the phase A line. The two remaining phases (i.e., phases B and C) are similarly produced with their own current switching cell pairs CSDB/$\overline{\text{CSDB}}$,CSDC/$\overline{\text{CSDC}}$ and trigger signals TB/$\overline{\text{TB}}$,TC/$\overline{\text{TC}}$.

This type of DC-to-AC power inverter is used in numerous applications, including high power circuits where relatively high DC voltages (e.g. 650 volts) must be converted to AC voltages. Such high power applications require the use of high power current switching cells and high current capacity power lines for the +DC and −DC buses and AC power lines.

A physical embodiment 30 of the switch matrix is shown in FIG. 2. As shown, each current switching cell includes a pair of transistor modules; for example, the current switching cell CSDA includes a transistor module Q1A and a transistor module Q3A. The current switching cells are interconnected according to the schematic of FIG. 1 via DC bus bars 34,34 for the +DC and −DC lines, and AC bars 36,38,40 for the AC phase A, phase B, and phase C connections. The bus bars 32,34,36,38,40 must have sufficient conductivity and physical size to accommodate the current levels used.

The transistor modules are commercially available, and designed for this simple bus bar interconnection approach. The appeal of this approach is both economical and practical; a variety of circuit topologies, including the inverter of FIG. 1, can be fabricated from a few simple metal bars and available modular components. This bus bar interconnection approach has been successfully applied with BJTs, SCRs and GTOs, all of which have relatively slow switching speeds. Problems arise, however, when this simple, economical approach is attempted with higher switching speed devices such as MOSFETs and IGBTs, and particularly when larger currents are being switched. High rates of change in current, on the order of 300 A/µsec–2000 A/µsec, appear in the faster devices. As will be explained later in more detail, the high rate of change of current (i.e. high di/dt) interacts with the relatively high characteristic inductance (L) of the bus bar to cause an excessively high voltage transient (V=Ldi/dt). High voltage transients stress the blocking voltage capability of the current switching cells. In order to withstand these transient voltages, the current switching cells must include higher voltage transistors, which are more costly. Furthermore, the voltage transients reduce reliability and decrease overall inverter efficiency. Another problem with the bus bar interconnection approach shown in FIG. 2, which will be described in more detail later, is that the bus bar structure serves as a source of electromagnetic emissions (noise) which can interfere with local low level trigger and control electronics.

The high characteristic impedance of the bus bar topology in FIG. 2 introduces significant parasitic inductances both in the DC bus circuit, and in the three phase branches. FIG. 3 is a schematic diagram of the DC-to-AC inverter, illustrating these parasitic inductances. When any current switching cell turns off, a voltage is generated across the inductances carrying that current that is proportional to the value of inductance and proportional to the rate of change of current in the device (V=Ldi/dt). If this transient is not controlled, a device failure is likely. As is known in the art, "snubber" networks may be used to control the switching transients.

A snubber network typically includes a number of passive elements interconnected within a pair of switching cells in the matrix 14. Reference is made to FIG. 4, which shows the pair of switching cells having an upper switching cell CSDU connected to the +DC bus and a lower switching cell CSDL connected to the −DC bus. A phase line is provided between the switches CSDU,CSDL. A discharge restraint snubber network SN includes diodes D1,D2, two capacitors C1,C2 and two resistors R1,R2 connected as shown between the +DC bus, the −DC bus, and the phase output. A series connected capacitor C1 and diode D1 are connected in parallel across the upper current switching cell CSDU. A similar series-connected capacitor C2 and diode D2 pair are connected in parallel across the lower current switching cell CSDL. A resistor R1 is connected to the anode of the diode D1, connecting the capacitor C1 to the −DC bus. Another resistor, R2 is connected to the cathode of the second diode D2, connecting the capacitor C2 to the +DC bus.

The snubber network SN operates as follows. After one of the current switching cells is turned off, the energy stored in the bus parasitic inductance is transferred to the respective snubber capacitor, which results in a controlled build up of capacitor voltage. The capacitor's charge is dissipated by the respective snubber resistor, causing an eventual reduction to the bus voltage across the capacitor. The dissipated energy is given up in the form of heat, evidencing a reduction in inverter efficiency. This reduced efficiency is traceable back to the parasitic inductance and characteristic impedance of the bus.

Additional problems with snubber networks include the cost of the additional components and the space requirements imposed by the circuitry. For the snubber network to effectively reduce voltage transients, the network should be located as physically close to the current switching cell as possible to minimize parasitic inductances between the snubber network and the current switching cell under protection.

Another problem with the bus bar structure shown in FIG. 2 stems from fact that the bus bar also serves as a radiating source of electromagnetic emission, a property that is traceable to the relatively high characteristic impedance of the bar. In operation, the current switching cells turn on and turn off frequently, and they generate a high rate of change of current (high di/dt). The high rate of change of current causes magnetic fields to radiate from the bus bar. The magnetic fields can interfere with sensitive low level electronics located in the vicinity of the bus bar structure. This problem is particularly acute when MOSFETs and IGBTs are used, because these devices quickly switch current at high rates of change, and require sensitive trigger circuits to be located as physically close as possible. The interfering magnetic fields can lead to mis-triggering of switching cells and unpredictable inverter operation.

As will be recognized from the foregoing, it would be desirable to provide a means for interconnecting large current switching cells in a manner that minimizes the resulting characteristic impedances. A low impedance, high power bus will provide reduced voltage transients, lower cost, higher efficiency and electromagnetic compatibility with low level switching electronics.

SUMMARY OF THE INVENTION

A power bus in accordance with the present invention provides a low characteristic impedance transmission line for conducting high power electrical energy with reduced transient signal effects; particularly, the power bus has a high distributed capacitance and low distributed inductance, and is useful in power electronics applications. The power bus has a structure that substantially confines the current induced magnetic fields between the conductors. The conductors are configured so that the flows of current therein are substantially balanced among two or more of the conductors. "Balanced currents" are defined as currents that are equal in amount and opposite in direction.

The present invention can be applied in a high power supply bus between a constant voltage source and a plurality of switching cells positioned at varying locations along the bus. Furthermore, a power bus, in accordance with the present invention, has use as a branch bus that couples the power supply bus to the switching cells. Particularly, in a DC-to-AC inverter that converts DC from a constant voltage source into three-phase AC, the branch bus has two conductors, one conductor that couples one polarity of the power supply bus with the switching cell, and another conductor that is part of one of the three phase lines. The switching cells can be switched at a high switching rate with reduced transient effects on the branch buses. The switching cells may switch on and off many times during a single AC cycle.

A high power bus constructed in accordance with the present invention includes a transmission line structure having two conductive bars positioned so that the current flow therethrough is substantially balanced (equal and opposing). Specifically, each conductive bar is positioned in a parallel relationship, and the current flows through the bars in opposing directions so that the magnetic field is substantially confined between the bars. The power bus is designed to transmit high power; specifically, it is designed to conduct large currents, with amperes in the range of hundreds or even thousands, and large voltage potentials, in range of hundreds of volts. The power bus includes a dielectric positioned between the conductive bars of the transmission line. Each bar may have two parallel flat sides, and in cross-section, each bar should be as wide and thin as possible, while having sufficient cross-sectional area to conduct the large current. When installed, the bars are preferably situated as closely as possible with their flat sides facing each other and a dielectric layer positioned between them.

In the described embodiment, the power bus is utilized as a low impedance, high power DC supply bus, and also as a low noise, high power branch bus that reduces voltage transients. The DC power supply bus conducts large currents between a constant voltage source and a plurality of branch buses positioned at different locations from the voltage source. Each branch bus includes a connector bar for connecting the bus with the electrical cell, and an AC bar on the AC side of the electrical cell. Each electrical cell may comprise a switching cell including a semiconductor such as an IGBT or a MOSFET.

On the AC side of each switching cell, an AC bar conducts current from the switching cells to the AC lines. Within each branch bus, the connector bars and the AC bars are positioned in an opposing, substantially parallel relationship closely together, and furthermore they are positioned so that their respective currents flow in an opposing relationship. A dielectric is positioned between the two bars.

In a preferred embodiment, each AC bar is connected to a extension bar that extends along the power supply bus. In this configuration, the extension bars are positioned closely with, and substantially parallel to, the DC bus bars of the power supply bus, so that a main bus is created from the combination of the AC extension bars and the DC power supply bus. The AC extension bars are situated with respect to the DC power supply bus so that the vector sum of the opposing currents in the DC power supply bus and the AC extension bars sum to approximately zero. Thus, a low-noise, low impedance configuration is provided that reduces voltage transients throughout, while confining the magnetic field to the areas substantially between the bars for reduced magnetic field emissions.

A power bus according to the present invention is particularly useful in switching amplifiers that switch DC electrical energy at high rates, such as DC-to-AC inverters. For example, to produce three phase, 60 Hz power, three AC phase buses will be provided, each corresponding to one of the three phases. The switches in the amplifier may turn on and off many times during a single 60 Hz cycle, subject to the control of a conventional controller.

The present invention has broader application than DC-to-AC inverters. In such power switching amplifiers, the switches are typically operated to provide AC (alternating current) at a particular frequency. However, the switches may also be operated to provide AC at other frequencies, or even to provide waveforms other than AC, periodic or non-periodic. Thus a power bus constructed in accordance with the present invention may be used in a large variety of switching amplifiers. Furthermore, a DC-to-AC inverter can operate the other way (as a AC-to-DC converter) simply by supplying AC power to the AC side. In other words, the AC power could be the input, and the DC power could be the output. Also, the inverter may be operated as a DC-to-DC converter; i.e., a circuit that converts one DC voltage to another DC voltage.

The AC branch buses, and the DC power supply bus reduce transient voltages, thereby increasing reliability and allowing use of lower cost switching components. Furthermore, the power buses have less stored magnetic energy, and therefore a considerably smaller, less expensive snubber network can be used. In some instances the power buses may entirely eliminate the need for snubber networks. Additionally, the power buses reduce electromagnetic radiation and also reduce the strength of magnetic fields and electric fields that could otherwise interfere with neighboring electrical components, thereby allowing low-voltage control circuits to operate without interference.

BRIEF DESCRIPTION OF THE DRAWINGS

Throughout the figures, common elements are identified with common designators.

FIG. 1 is a schematic diagram of a conventional DC-to-AC power inverter.

FIG. 2 is a perspective view of a conventional power bus structure in a conventional DC-to-AC power inverter.

FIG. 3 is a schematic view of a conventional DC-to-AC power inverter, illustrating the parasitic inductances of the transmission lines.

FIG. 4 is a schematic diagram of a conventional "snubber" network.

FIG. 5 is a schematic diagram of a DC-to-AC inverter in the preferred embodiment of the present invention.

FIG. 6 is a perspective view of a preferred embodiment of a low-noise power bus structure.

FIG. 7 is a plan view of a portion of the low-noise power bus structure of FIG. 6.

FIG. 8 is a cross-sectional view taken along line 8—8 of FIG. 7.

FIG. 9 is a cross-sectional view taken along line 9—9 of FIG. 8.

FIG. 10 is a perspective view of a DC power bus bar from the low-noise power bus of FIG. 6.

FIG. 11 is a perspective view of an AC power bus bar from the low-noise power bus of FIG. 6.

FIG. 12 is a perspective view of another preferred embodiment of a low-noise power bus structure in accordance with the present invention.

FIG. 13 is a plan view of a portion of the low-noise power bus structure of FIG. 12.

FIG. 14 is a cross-sectional view taken along line 14—14 of FIG. 13.

FIG. 15 is a perspective view of one embodiment of a DC power bus bar and a bus connector bar, according to the low-noise power bus of FIG. 12.

FIG. 16 is a perspective view of an AC power bus bar, according to the low-noise power bus of FIG. 12.

FIG. 18 is a table that illustrates balanced current flow in the embodiment of FIG. 12.

DETAILED DESCRIPTION OF THE PREFERRED EMBODIMENT

Figure 17:
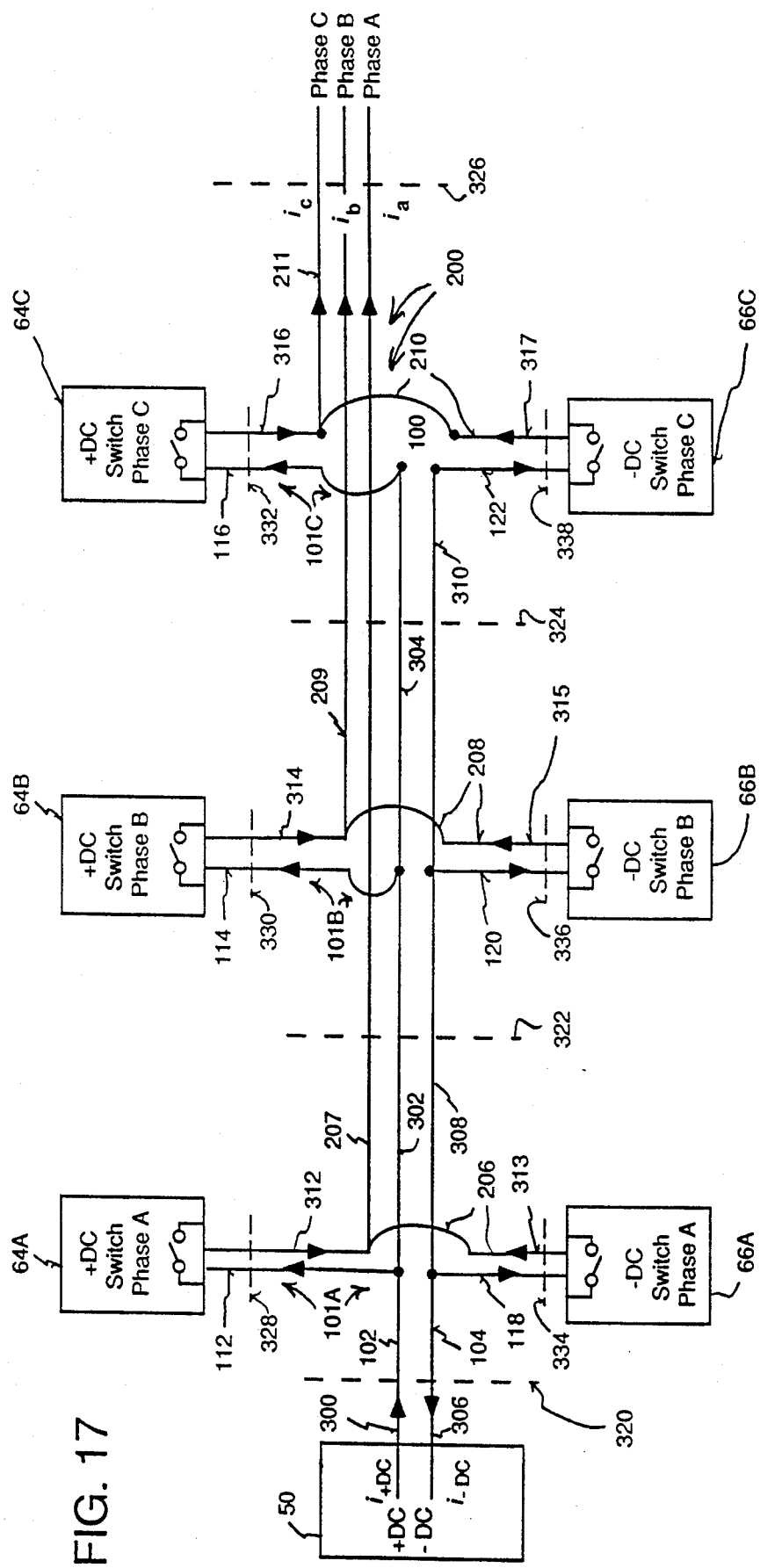
FIGS. 17 is a diagram of the power bus structure of the embodiment of FIG. 12, for illustrating current flow therein.

A low-noise power bus in accordance with the present invention can be used in a DC-to-AC power inverter in the system described in a commonly assigned, co-pending patent application having Ser. No. 07/649,567, entitled "VARIABLE SPEED WIND TURBINE", and filed by R. D. Richardson and W. L. Erdman on Feb. 1, 1991.

The preferred embodiment of the present invention is used in a three phase inverter. For purposes of clarity in explanation, the inverter circuit will be assumed to be operated as a DC-to-AC inverter. However, it should be understood that the DC-to-AC inverter can operate the other way (as a AC-to-DC converter) simply by supplying AC power to the AC side. In other words, the AC power could be the input, and the DC power could be the output. Also, the inverter described herein includes circuitry that can be operated as a DC-to-DC converter; i.e., a circuit that converts one DC voltage to another DC voltage. Furthermore, in addition to AC, any of a number of waveforms, periodic or nonperiodic, can be generated in the circuit.

A schematic diagram of the preferred embodiment is shown in FIG. 5. A conventional power supply 50 includes a first DC voltage source 52 and a second DC voltage source 54 connected in series with an independent ground 56 between them. The power supply on a line 58 is +DC, and the power supply on a line 60 is −DC. The power supplies +DC, −DC are provided to a DC-to-AC inverter 62, which includes a plurality of current switching cells 64,66. The +DC current switching cells 64 each include a pair of transistors Q1,Q3 connected in a parallel configuration, and the −DC current switching cells 66 each include a pair of transistors Q2,Q4 connected in a parallel configuration. The current switching cells 64,66 are controlled respectively by controlling inputs 70,72, provided by conventional controllers. For example, conventional voltage source gate drive circuits are used if the switching cells 64,66 include MOSFETs or IGBTs. The relatively low-voltage circuits in the controlling inputs 70,72 may be greatly affected by electromagnetic noise or magnetic fields. However, it is important that each controlled be located close to their respective transistor pair, in order to keep the lengths of the connecting lines as short as possible. A short connecting line reduces inductance, thereby reducing the switching time. The controllers are designed to operate at high switching rates and provide three phase PWM control signals, which require that the switches 64,66 switch on and off many times during a single 60 Hz cycle.

The current switching cells 64,66 operate as pairs; specifically, the +DC current switching cell 64A is paired with the −DC current switching cell 66A to provide a phase A line 74, the +DC current switching cell 64B is paired with the −DC current switching cell 66B to provide a phase B line 76, the +DC current switching cell 64C is paired with the −DC current switching cell 66C to provide a phase C line 78. At any time during operation of the three phase inverter, one or the other of the current switching cells 64,66 are on; for example at any time t, either 64A or 66A, but not both, is on. The control signals on the lines 70,72 are controlled in a conventional manner to provide the desired waveforms on the phase lines 74,76,78. Typically, the control signals on the lines 70,72 will be operated to produce three phase AC power at a 60 Hz frequency. However, the control signals can operate the switches 64,66 to provide AC (alternating current) at other frequencies, or even to provide waveforms other than AC.

The present invention provides a power bus assembly that has low characteristic impedance and low-noise characteristics when applied in the DC-to-AC inverter of FIG. 5. The characteristic impedance ($Z_o$) of a general transmission line is defined by the following formula:

$$Z_o \approx \sqrt{\frac{L}{C}}$$

Thus, it can be seen that the distributed characteristic impedance ($Z_o$) is proportional to the square root of the distributed inductance (L), and inversely proportional to the square root of the distributed capacitance (C). In other words, impedance can be decreased by reducing the inductance or by increasing the capacitance.

The power bus assembly of the preferred embodiment has a high distributed capacitance and a low distributed inductance as a result of employing a parallel bus bar structure, including at least two conductive bars positioned in a parallel relationship, with a dielectric positioned between them. The direction of current flow in one bar is opposed to the direction of current flow through the other, and thus, the magnetic field is confined between the two conductors.

Referring to FIG. 5 and FIG. 6, the DC-to-AC three phase inverter includes parallel bar buses in at least two positions: a low-noise power supply bus 100 that supplies current to all the current switching cells 64,66, via AC branch buses 101A,101B,101C. Each AC branch bus 101 extends across a respective pair of current switching cells 64,66, to both supply current to the respective current switching cells 64,66, and to provide the respective phase line 74,76,78. In the power supply bus 100, and in the branch buses 101, the flows of current through the opposing, proximate conductors are substantially balanced (in opposing directions and in equal amounts).

The power supply bus 100 is connected to the power supply 50; specifically a +DC bus bar 102 conducts current from the positive DC side of the power supply 50, and a −DC bus bar 104 conducts current to the negative DC side of the power supply 50. The −DC bus bar 102 has two parallel flat surfaces, as does the −DC bus bar 104. The DC bus bars 102,104 are positioned in a parallel relationship, with respect to each other, so that their parallel surfaces are opposing. The power supply bus 100 is adapted to conduct large currents of many several hundred amperes, and withstand high voltages of many hundred volts. The power supply bus 100 of the preferred embodiment is designed for a peak voltage of 850 volts and a peak current of 300 amperes, and therefore, the bus bars 102,104 have the cross-sectional dimensions of 1/16" by 2.0". The bus bars 102,104 in the preferred embodiment are fabricated substantially of copper. However, it should be understood that other fabrication materials which are sufficiently conductive, such as aluminum, can be used according to the present invention, and that the bus bars may have other dimensions, as long as the bus bars have a size, shape and material sufficient to carry the large current.

The phase A branch bus 101A includes an AC bar 106 for conducting the AC for phase A; the phase B branch bus 101B includes an AC bar 108 for conducting the AC for phase B; and the phase C branch bus 101C includes an AC bar 110 for conducting the AC for phase C.

The phase A branch bus 101A also includes a bus connector bar 112 for coupling the positive DC (+DC) from a junction with the +DC bus bar 102 to the collectors of transistors Q1A and Q3A, and a bus connector bar 118 for coupling the negative DC (−DC) from a junction with the −DC bus bar 104 to the emitters of transistors Q2A and Q4A. Similarly, the phase B branch bus 101B includes a bus connector bar 114 for coupling the positive DC (+DC) from a junction with the +DC bus bar 102 to the collectors of transistors Q1B and Q3B, and a bus connector bar 120 for coupling the negative DC (−DC) from a junction with the −DC bus bar 104 to the emitters of transistors Q2B and Q4B. Furthermore, the phase C branch bus 101C includes a bus connector bar 116 for coupling the positive DC (+DC) from a junction with the +DC bus bar 102 to the collectors of transistors Q1C and Q3C, and a bus connector bar 122 for coupling the negative DC (−DC) from a junction with the −DC bus bar 104 to the emitters of transistors Q2C and Q4C. The bus connector bars 112,114,116,118,120,122 are discussed more fully below.

The DC bus connector bars 112,114,116,118,120,122, and the AC bars 106,108,110 are adapted to conduct large currents of several hundred amperes, and withstand high voltages of many hundred volts. In the preferred embodiment, they are designed for a peak voltage of 850 volts and a peak current of 300 amperes; and therefore, the bars 106,108,110,112,114,116,118,120,122 have the cross-sectional dimensions of 1/16" by 2.0".

Although specific dimensions have been provided for the preferred embodiment, it should be understood that other dimensions may be appropriate in other applications. The dimensions, such as the thickness and width, of the bus bars 102,104,106,108,110 and bus bar connector bars 112,114,116,118,120,122 are selected to minimize the characteristic impedance ($Z_o$) of a parallel bar bus while providing the desired conductivity for the expected current within the physical limitations of the structure housing the DC-to-AC inverter. The characteristic impedance ($Z_o$) of a parallel bar bus structure, with a dielectric between the bars, is approximately given by the following formula:

$$Z_o \approx 377 \frac{b}{\omega \cdot \sqrt{\epsilon_R}}$$

where b is the thickness of the dielectric between the bars, w is the width of a cross-section of the bars, and $\epsilon_R$ is the dielectric constant of the dielectric material between the bars. Thus, it can be seen that the impedance is minimized by choosing the width of the dielectric to be as small as possible, and the width of the bars to be as large as possible, within physical and cost constraints.

Although in the preferred embodiment, these bars are fabricated substantially of copper, it should be understood that other fabrication materials which are sufficiently conductive, such as aluminum, can be used according to the present invention.

The DC bus connector bars 112,118 and the AC bars 106 have flat surfaces that face each other in a respectively opposing relationship. These flat surfaces substantially parallel each other. Reference is made to FIG. 7, which is a plan view of the AC bus 106, to FIG. 9, which shows a cross-section of the AC branch bus 101A, and to FIG. 11, which is a perspective view of the AC bus bar 106. Particularly, a flat surface 123 on the AC bus bar 106 opposes a flat surface 125 provided on the −DC bus connector 118. Also, a flat surface 127 on the AC bus bar 106 is provided that opposes a flat surface 129 on the +DC bus connector 112. Similarly, the DC bus connector bars 114,120, and the AC bar 108 have flat surfaces that face each other in a respectively opposing relationship, and the DC bus connector bars 116,122, and the AC bar 110 have flat surfaces that face each other in a respectively opposing relationship.

The +DC bus connector bars 112,114,116 each have flanges 124 which are coupled (e.g. bolted or screwed) to the collectors of the transistors Q1A,Q3A,Q1B,Q3B,Q1C,Q3C. Similarly, the −DC bus connector bars 118,120,122 each have flanges 126 which are coupled to the emitters of transistors Q2A,Q4A,Q2B,Q4B,Q2C and Q4C. Furthermore, the AC bars 106,108,110 have flanges 128 which are coupled to the emitters of transistors Q1A,Q3A,Q1B,Q3B,Q1C and Q3C, and to the collectors of transistors Q2A,Q4A,Q2B,Q4B,Q2C, and Q4C.

Interposed between the DC bus bars 102,104 is a dielectric layer 130. Similar dielectric layers 132,134,136 are interposed between the +DC bus connector bars 112,114,116 and the AC bars, 108,110. Further similar dielectric layers 138,140,142 are interposed between the −DC bus connector bars 118,120,122 and the AC bars 106,108,110.

Referring to FIG. 7, the relative positioning of the DC and AC bars, with the layers of dielectric and DC bus connector bars can be better understood. The view in FIG. 7 illustrates the interposition of the foregoing elements for the phase A elements. The +DC bus bar 102 and −DC bus bar 104, with their interposed dielectric 130, extend between the upper phase A transistors Q1A and Q3A and the lower phase A transistors Q2A and Q4A (FIG. 6). Coupling the +DC bus bar 102 to the collectors of transistors Q1A and Q3A is the +DC bus connector bar 112. Coupling the −DC bus bar 104 to the emitters of transistors Q2A,Q4A is the −DC bus connector bar 118. This coupling between the bus connector bars 112,118 and their respective bus bars 102,104 can be accomplished by any of several means known in the art, such as brazing, soldering, spot welding, or preferably by unitary construction of the bus connector bars 112,118 with their respective bus bars 102,104. An example of a bus bar and bus connector bar assembly is shown in FIG. 10, and an example of unitary construction of the assembly is shown in FIG. 15.

The AC bar 106 couples the emitters of transistors Q1A,Q3A to the collectors of transistors Q2A,Q4A. The AC bar 106 is separated and insulated from the DC bus connector bars 112,118 by two dielectric layers 132,138.

Referring to FIG. 8, a cross-sectional view of the bus structure, taken along line 8—8 of FIG. 7, is shown. In this view, the elevational relationship between the power bus 100 and the transistors Q1A,Q2A,Q3A,Q4A can be better understood.

Referring to FIG. 9, a cross-sectional view taken along line 9—9 of FIG. 8 is illustrated. In this view, the elevational relationship between the AC bar 106, its dielectric layers 132,138, the +DC bus bar 102 and its dielectric 130 can be better understood.

Referring to FIG. 10, a perspective view of the −DC bus bar 104 with its lateral bus connector bars 118,120,122 is shown. In accordance with FIG. 6 and the foregoing discussion, it should be understood that the +DC bus bar 102 is of similar design. (Unitary construction of the −DC bus bar and the bus connector bars is shown in FIG. 15.)

Referring to FIG. 11, a perspective view of the AC bar (for phase A) 106 is illustrated. In accordance with FIG. 6 and the foregoing discussion, it should be understood that the other AC bars 108,110 are of similar designs.

The dielectric layers 130,132,134,136,138,140,142 interposed between the bars in the buses 100,101 are each preferably fabricated substantially of a fiberglass and epoxy mixture, commonly referred to as "G-10," with a relative permittivity of approximately ten ($\epsilon_R = 10$). However, other dielectrics can also be used, such as mylar, ceramic, or, where economics permit, barium titanate ($\epsilon_R = 10,000$). The dielectric used should preferably have a high relative permittivity, or dielectric constant, e.g. at least equal to ten. The thickness of the dielectric is selected to provide a low characteristic impedance within the constraints of the material, which may be quite thin. In the preferred embodiment, the thickness of the dielectric is approximately 0.03-0.06 inch, while the lengths and widths are generally similar to the corresponding lengths and widths of the bars between which the dielectric is interposed. The width of the dielectric is preferably selected to be at least as wide as the width of the adjacent bars, and preferably extends beyond the edges of the adjacent bars to provide a sufficient voltage creepage distance.

Reference is made to FIG. 12, which shows another preferred embodiment of the present invention. The embodiment of FIG. 12 includes features similar to the embodiment illustrated in FIGS. 6-11; these features are numbered similarly, with numbers in the range 100 to 200, and reference is made to the description accompanying those Figures for a more detailed explanation of these features. However, the embodiment of FIG. 12 includes additional features.

A low-noise main bus 200 includes the power supply bus 100 and an extension bar for each AC bar 206, 280, 210. Specifically, for phase A, an AC extension bar 207 is connected to the bottom of the AC bar 206. The AC extension bar 207 has a flat section 205 (FIG. 16) that extends along, and is parallel with, the main bus 200. Specifically, the flat section 205 is positioned in opposing relation with similar flat sections on the bus bars 102, 104 for power supply bus 100. The extension bar 207 extends from its junction with the AC bar 206 in a direction away from the power supply 50. Similarly, for phase B, an AC extension bar 209 is connected to the bottom of the AC bar 208, and the AC extension bar 209 has a flat section that extends along, and is parallel with, the power supply bus 100, and for phase C, an AC extension bar 211 is connected to the bottom of the AC bar 210, and the AC extension bar 211 has a flat section that extends along, and is parallel with, the power supply bus 100. The extension bars 209, 211 extend from their junctions with the respective AC bars 208, 210 in a direction away from the power supply 50.

Thus, a main bus 200 is provided that includes a number of parallel bars: the +DC bus bar 102, the −DC bus bar 104, and the three AC extension bars 207, 209, 211. The bars are separated from each other by dielectric layers; the DC bus bars 102, 104 are separated by the dielectric 130, the bus bar 104 is separated from the phase A extension bar 207 by a dielectric layer 213, the phase A extension bar 207 is separated from the phase B extension bar 209 by a dielectric layer 215, and the phase B extension bar 209 is separated from the phase C extension bar 211 by a dielectric layer 217. Preferably, all bars on the main bus 200 are positioned closely; therefore the dielectric layers 130, 213, 215, 217 should be thin to place the bars close together. The main bus 200 is shown in FIG. 12 with a preferred configuration, having an order, from right to left, including the −DC bus bar 104, the +DC bus bar 102, the extension bar 207, the extension bar 209, and the extension bar 211. Other configurations are also acceptable; i.e., the bars 102, 104, 207, 209, 211 in the main bus 200 can be configured in any convenient order. For example, the extension bar 217 could be placed next to the −DC bus bar 104.

Referring to FIG. 14, a cross-sectional view, taken along line 14—14 of FIG. 13, is shown. In this view, the elevational relationship between the power bus 200 and the transistors Q1A, Q2A, Q3A, Q4A can be better understood.

Referring to FIG. 15, a perspective view of an embodiment, of unitary construction, of the −DC bus bar 104 with its lateral bus connector bars 118, 120, 122 is shown. The −DC bus bar 104 as shown in FIG. 15 is constructed from a single mold, so that it is one piece, and the junctions between the −DC bus bar 104 and the bus bars 118, 120, 122 do not extend from the side of the −DC bus bar 104. In accordance with FIG. 12 and the foregoing discussion, it should be understood that the +DC bus bar 102 can be of similar design.

Referring to FIG. 16, a perspective view of the AC bar (for phase A) 206 and the AC extension bar 207 is shown. In accordance with FIG. 12 and the foregoing discussion, it should be understood that the other AC bars 208, 210 are of similar designs.

Reference is made to FIG. 17, which is a diagrammatic illustration of current flow through the power bus embodiment of FIG. 12. Specifically shown are all the bus bars, the power supply 50, the +DC switches 64A, 64B, 64C, and the −DC switches 66A, 66B, 66C. The FIG. 17, together with FIG. 18 (Table 1), included in the following discussion, is used to show that the current flow through the various power buses will be balanced (equal and opposite) at any time during operation. FIG. 18 (Table 1) shows the results of the on-off possibilities for the switches 64, 66, illustrating that current flow in the bus bars will be substantially balanced under any of these possibilities, and thus, the magnetic fields will be substantially confined to the area between the bus bars.

In FIG. 17, the power supply bus bars 102, 104 are divided into sections for purposes of illustration of current flow through representative cross-sections. Specifically, the +DC bus bar 102 is divided into a first section 300 that connects the power supply 50 with the phase A bus connector bar 112, a second section 302 that connects the phase A bus connector bar 112 with the phase B bus connector bar 114, and a third section 304 that connects the phase B bus connector bar 114, with the phase C bus connector bar 116. Similarly, for the purpose of illustrating current flow through representative cross-sections, the power supply bus bar 104 is divided into sections. Specifically, the −DC bus bar 104 is divided into a first section 306 that connects the power supply 50 with the phase A bus connector bar 118, a second section 302 that connects the phase A bus connector bar 118 with the phase B bus connector bar 120, and a third section 304 that connects the phase B bus connector bar 120 with the phase C bus connector bar 122.

For the purpose of illustrating current flow, the AC bars 206, 208, 210 are divided into sections. Specifically, the phase A bar 206 is divided into two sections: an upper section 312 between the +DC switch 64A and the extension bar 207, and a lower section 313 between the −DC switch 66A and the extension bar 207. Similarly, the phase B bar 208 is divided into two sections: an upper section 314 between the +DC switch 64B and the extension bar 209, and a lower section 315 between the −DC switch 66B and the extension bar 209. Also similarly, the phase C bar 210 is divided into two sections: an upper section 316 between the +DC switch 64C and the extension bar 211, and a lower section 317 between the −DC switch 66C and the extension bar 211.

Current flow along the main bus 200 can be viewed at the main bus cross-sections shown by the dotted lines 320, 322, 324, 326 in FIG. 17. Current flow will be seen to be substantially balanced (equal and opposite) at all these cross-sections. Furthermore, current flow along the AC buses 101A, 101B, 101C can be viewed at bus cross-sections 328, 330, 332, 334, 336, 338. Current flow along the AC buses 101A, 101B, 101C will also be seen to be substantially balanced.

Looking first at current flow in the buses 101A, 101B, 101C, it should be noted that none of the switches 64, 66 have current sources or sinks. Therefore, the input current, $i_{in}$, into each switch 64, 66 will be equal to the output current, $i_{out}$, leaving the respective switch 64, 66. For example, at the cross-section shown by the dotted line 328, the current $i_{in}$ into the phase A switch 64A is provided along the bus connector bar 112 in the direction toward the switch 64A, and the equal current $i_{out}$ is provided along the phase A bar upper section 312, in a direction away from the switch 64A. The phase A bar upper section 312 is positioned proximate and parallel to the bus connector bar 112; therefore, the currents $i_{in}$ and $i_{out}$ are balanced (equal and opposing). Similar analyses apply to the currents along the cross-section lines 330, 332, 334, 336, 338, and therefore those currents are respectively balanced. Specifically, the currents are balanced in the phase B bar upper section 314 and the bus connector bar 114, the currents are balanced in the phase C bar upper section 316 and the bus connector bar 116, the currents are balanced in the phase A bar lower section 313 and the bus connector bar 118, the currents are balanced in the phase B bar lower section 315 and the bus connector bar 120, and the currents are balanced in the phase C bar lower section 317 and the bus connector bar 122. A careful observer may notice that the AC bar sections 312, 313, 314, 315, 316, 317 parallel their respective bus connector bars 112, 118, 114, 120, 116, 122, through most of their lengths; however, there is a very small portion, over the main bus 200, in which they do not overlap. The non-overlapping portion can be kept to a minimum by careful design and by reducing the width of the main bus 200.

Looking now at current flow along the main bus 200, from the right in FIG. 17, three phase power is directly connected to the Phase A, Phase B, and Phase C extension bars 207, 209, 211. For three-phase power, it is known:

$$i_a + i_b + i_c = 0,$$

where $i_a$ is the current in the Phase A extension bar 207, $i_b$ is the current in the Phase B extension bar 209, and $i_c$ is the current in the Phase C extension 211, and $i_a$, $i_b$, and $i_c$ can be any value: positive, negative, or zero. Thus, along the cross-section shown by the dotted line 326, the currents will always sum to zero, as illustrated on the bottom lines of the FIG. 18 (Table 1). The arrows on the main bus 200 in the diagram of FIG. 17 are all shown pointing in a direction from left to right, but it should be understood that the actual direction of current flow may be in either direction, or the current may be zero. The direction of current flow is taken into account in the above equation as the sign of the current: positive or negative.

Looking now at current flow along the main bus 200, from the left in FIG. 17, the power supply 50 is directly connected to the first bus portions 300, 306. The first dotted line 320 crosses the first bus portions 300, 306 just beyond the power supply 50, and therefore current flow through each bus portion 300, 306 will be balanced (equal and opposite). If the current flow from the power supply 50 along the first portion 300 of the bus 102 is $i_{+DC}$, then the current flow along the first portion 306 of the bus 104 is $i_{-DC}$, and from fundamental principles, $i_{+DC} = i_{-DC}$.

In the DC-to-AC inverter, the current switching cells (switches) 64, 66 operate in phase pairs, with one "on" and the other "off". As an example, if the +DC switch 64A is off, then its partner, the −DC switch 66A, will be on; conversely, if the switch 64A is on, then its partner switch 66A will be off.

As has been stated, the net current, from a vector standpoint, is zero at the cross-sections 320, 322, 324 in the main bus bar 200, and in the cross-section 326 including the three phase lines extending beyond the end of the main bus 100. A detailed analysis of current flow can be done with using FIG. 17, and FIG. 18 (Table 1). The analysis requires consideration of eight alternatives. For the first six of the alternatives, it can be said that, regardless of the manner in which the currents are divided between the bars 102, 104, 207, 209, 211 on the main bus 200, the total +DC current (left to right in FIG. 17) is $i_{+DC}$ at all the current cross-sections 320, 322, 324, and the total −DC current (right to left in FIG. 17) is always $i_{-DC}$. The approach taken in FIG. 18

(Table 1) is another approach, in which all cross sectional currents are written in terms of $i_a$, $i_b$, and $i_c$. Using this approach it can be shown that the current cross-sections 320, 322, 324, 326 all contain $i_a+i_b+i_c$ flowing therein, which must equal zero, and thereby these cross-sections have balanced current flows. The eight alternatives are presented in FIG. 18 (Table 1), which shows the current flowing in the respective bus bar listed under the combinations of the switches 64A, 64B, 64C, 66A, 66B, 66C listed on the top entries of the FIG. 18 (Table 1).

For example, in Alternative I in FIG. 18 (Table 1), wherein the +DC phase A switch 64A is on and the other +DC switches 64B, 64C are off, then the +DC current $i_a$ flows from the power supply 50, across the first +DC bus bar section 300, up through the bus connector bar 112 to the phase A switch 64A, down through the phase A bar upper section 312, and across the phase A bus extension bar 207 to the phase A line. No other +DC current flows from left to right; the current flow is zero through the second +DC bus bar section 302 and the third +DC bus bar section 304. Looking at the −DC current, the −DC phase A switch 66A is off, while the −DC switches 66B, 66C are on. Thus, the current $i_b+i_c$ flows along the first −DC bus bar section 306 and the second −DC bus bar section 308. Thereafter, current is split between the −DC phase B connector bar 120 and the third −DC bus bar section 310. The −DC current flow through the phase B connector bar 120 will be $i_b$, which is the −DC current on the phase B extension bar 209. The −DC current flow through the −DC bus bar section 310 will be $i_c$, which is the current flow through the phase C extension bar 211.

As indicated in the totals in FIG. 18 (Table 1) for Alternative I, as well as the next five alternatives (II-VI), the total current flowing in each of the current cross-sections 320, 322, 324, 326 is $i_a+i_b+i_c$, which equals zero. However, for Alternative VII, in which all −DC switches 66 are on, and for Alternative VIII, in which all +DC switches 64 are on, no current is flowing in the cross-section 320 nearest the power supply 50. In the Alternative VII, the current is flowing between the −DC switches 66A, 66B, 66C, and the direction of those current flows is changeable. Similarly, in the Alternative VIII, the current is flowing between the switches 64A, 64B, 64C, and the direction of those current flows is changeable. However it can still be shown that the currents are substantially balanced. At the cross-section 322, as noted in FIG. 18 (Table 1), if current in one direction is $i_a$, then current in the opposite direction is $-i_a$, and thus these currents sum to zero. At the other cross-sections 324 and 326, the currents sum to $i_a+i_b+i_c$, which equals zero. Thus, for Alternatives VII and VIII, the currents are also substantially balanced.

Constructing a power bus in accordance with the foregoing discussion results in a low-noise power bus in accordance with the present invention. The power bus of the present invention substantially reduces stray parasitic inductances and distributes stray parasitic capacitances throughout the power bus assembly.

The high capacitance causes transient signal effects to be substantially diminished, which reduces electrical stress upon the electronic components. Further, the diminished transient signals reduce the need for snubber networks, e.g. by reducing the requisite sizes and performance ratings thereof, or even entirely eliminating the need for snubber networks.

A low-noise power bus in accordance with the present invention can be used in a number of applications in which large amounts of DC current must be conducted and switched at high switching rates. For example, such applications would include, without limitation, switching DC power supplies, DC-to-DC power converters, single or multiphase DC-to-AC power inverters, and variable frequency AC power supplies, that could be used in a wide range of applications such as wind turbines, adjustable speed motor drives, and uninterruptible power supplies.

It should be understood that various alternatives to the embodiments of the present invention described herein can be employed in practicing the present invention. It is intended that the following claims define the scope of the present invention, and that structures and methods within the scope of these claims and their equivalents be covered thereby.

What is claimed is:

1. A low-noise power bus assembly with balanced current flow and reduced transient signal effects, for conducting DC current for high speed switching by high speed transistors, and for conducting an AC waveform defined by switching said high speed transistors, said power bus assembly comprising:

an assembly having a first plurality of conductors coupled to said high speed transistors to receive and conduct DC current, and further having a second plurality of conductors coupled to said high speed transistors to receive and conduct AC current, said first conductors and said second conductors positioned in groups, each group including at least two of said conductors, and within each of said groups, the conductors having a shape and relative position so that each conductor is positioned with respect to at least one adjacent conductor and the currents flowing through each of said adjacent conductors are substantially balanced (equal in amount and opposite in direction); and, a plurality of dielectric layers disposed within said assembly, wherein said dielectric layers are interposed between said adjacent conductors.

2. The low-noise power bus assembly as claimed in claim 1, wherein each of said first and second conductors comprise the shape of a bar having a flat surface facing the conductor positioned adjacent thereto, so that adjacent conductors have opposing, flat surfaces and a magnetic field created by a balanced current flow through said conductors is substantially concentrated between said adjacent conductors.

3. The low-noise power bus assembly as claimed in claim 1, wherein said high speed transistors are high power transistors for switching power for power electronics uses.

4. A low-noise power bus assembly with balanced current flow and reduced transient signal effects, for conducting DC current for high speed switching, and for conducting an AC waveform, said power bus assembly comprising:

a plurality of switching cells, each of which includes at least one high power transistor;

an assembly having a first plurality of conductors coupled to receive and conduct DC current to said plurality of switching cells, and further having a second plurality of conductors coupled to receive and conduct AC current from said plurality of switching cells, said first conductors and said second conductors having a shape and relative position so that a magnetic field created by the currents flowing therein are substantially contained between said first and second conductors, and wherein two or more of said first and second conductors are configured so that the currents flowing therein are substantially balanced (equal in amount and opposite in direction);

a plurality of dielectric layers disposed within said assembly, wherein said dielectric layers are interposed between said conductors; and wherein the assembly has a configuration for a DC-to-AC three phase inverter so that said first conductors include a DC power supply bus;

said second conductors include a phase A extension bar, a phase B extension bar, and a phase C extension bar; and, said extension bars and said power supply bus are positioned in a parallel configuration so that the flows of current within said extension bars and said DC power supply bus are substantially balanced.

5. The low-noise power bus assembly as claimed in claim 4, wherein the first conductors further include a plurality of bus connectors for connecting the power supply bus with the switching cells, and a plurality of AC bars for connecting the switching cells with the AC extension bars, and the bus connectors and the AC bars are positioned in an adjacent relationship so that the flows of current therein are substantially balanced (equal and in opposite directions).

6. The low-noise power bus assembly as claimed in claim 1, wherein said first and second conductors have a cross-sectional size suitable to conduct current for power electronics uses.

7. A low impedance, low-noise, high power supply bus for conducting a large current between a constant voltage source and a plurality of electrical cells including high speed, high power switching transistors, said electrical cells being positioned along the bus at various locations, said high power supply bus comprising:

a pair of current conductive bars for connecting the voltage source with the plurality of electrical cells, wherein said conductive bars have a cross-sectional size suitable to conduct current for power electronics uses, the conductive bars having parallel, opposing flat surfaces, said pair of bars being positioned, with respect to the voltage source and the plurality of electrical cells, so that the current flows therethrough in respectively opposing directions;

a dielectric positioned between said pair of conductive bars; and, means for connecting the power supply bus with the plurality of electrical cells, said means being physically positioned at selected locations along the length of the power supply bus.

8. A low-noise low impedance high power branch bus providing a current path between a DC power supply bus and a phase line of an AC source, through a pair of high power, high speed switching cells including a first switching cell and a second switching cell, the DC power supply bus positioned between the first and second switching cells, and also providing a current path for an AC waveform from the pair of switching cells, said branch bus comprising:

a first bus connector bar for conducting current between DC voltage power supply bus and the first switching cell, wherein said first bus connector bar has a cross-sectional size suitable to conduct current for power electronics uses, and said first bus connector bar has a first flat surface;

a second bus connector bar for conducting current between DC voltage power supply bus and the second switching cell, wherein said second bus connector bar has a cross-sectional size suitable to conduct current for power electronics uses, and said second bus connector bar has a second flat surface;

an AC bar for conducting current from the pair of switching cells to the phase line, said AC bar having a cross-sectional size suitable to conduct current for power electronics uses, said AC bar positioned in an opposing, substantially parallel relationship facing the bus connector bar, said AC bar being positioned to conduct current in a direction opposed to the direction of current flow through the bus connector bar, said AC bar having a third flat surface positioned opposing the first flat surface of the first bus connector bar, and a fourth flat surface positioned opposing the second flat surface of the second bus connector bar; and, a dielectric positioned between said flat surfaces of the first and second bus connector bars and said AC bar.

9. A low-noise, low impedance power bus assembly that substantially confines a current induced magnetic field within its physical boundaries, said assembly switching DC electrical power among a plurality of high speed electrical switching cells, said power bus assembly comprising:

a power supply bus for conducting DC current, said power supply bus including a pair of parallel bus bars having flat, opposing adjacent surfaces positioned so that their current flows are in respectively opposing directions, said power supply bus further including a dielectric positioned between the flat, opposing surfaces on the adjacent parallel bus bars; and, a plurality of branch buses positioned at various locations along the length of the power supply bus, each branch bus including;

at least one DC bus connector bar connecting the power supply bus with a respective switching cell, said DC bus connector bar including a flat surface;

an AC bar coupled to the respective switching cell, said AC bar having a flat surface situated in an opposing, parallel relationship adjacent with the flat surface on the DC bus connector bar so that the current flow through the AC bar opposes the current flow through the DC bus connector bar and so that the flows of current in said bars are substantially balanced; and, a dielectric positioned between the adjacent surfaces of each AC bar and the proximate DC bus connector bars.

10. The power bus assembly as claimed in claim 9, further comprising a plurality of AC extension bars, each of said AC extension bars being electrically coupled to a respective AC bar, said extension bars being positioned in a parallel, adjacent relationship with the power supply bus, so that the flows of current within said adjacent extension bars and power supply bus are substantially balanced.

11. A low-noise, low impedance power bus assembly for conducting electrical power between a constant DC voltage supply and an AC waveform, using a plurality of switching cells for switching between AC and DC electrical power, said power bus assembly comprising:
    a power supply bus for conducting DC current to the switching cells, said power supply bus including a pair of parallel bus bars, a +DC bus bar and a −DC bus bar, positioned in an adjacent relationship so that the flows of current in said bus bars are in respectively opposing directions, and further including a dielectric positioned between said adjacent bus bars;
    a first +DC bus connector bar for connecting the +DC bus bar to a first +DC electrical switching cell;
    a first −DC bus connector bar for connecting the −DC bus bar to a first −DC electrical switching cell, said first bus connector bars being positioned on opposite sides of the power supply bus;
    a first AC bar having a first end coupled to the first +DC electrical switch, and a second end coupled to the first −DC electrical switch, said first AC bar having a +DC section situated in an opposing, parallel, adjacent relationship with the first +DC bus connector bar, and a −DC section situated in an opposing, parallel, adjacent relationship with the first −DC bus connector bar so that the current flow through each section of the first AC bar opposes the current flow through the adjacent DC bus connector bar; and,
    a dielectric layer positioned between the adjacent sections of the first AC bar and the first DC bus connector bars.

12. The power bus assembly as claimed in claim 11; further comprising a main bus including:
    the power supply bus; and,
    a first AC extension bar coupled to the first AC bar, said first AC extension bar being positioned adjacent to the power supply bus so that it parallels the power supply bus, and also comprising a dielectric layer positioned between the power supply bus and said first AC extension bar.

13. The power bus assembly as claimed in claim 11, further comprising:
    a second +DC bus connector bar for connecting the +DC bus bar to a second +DC electrical switching cell, and a second −DC bus connector bar for connecting the −DC bus bar to a second −DC electrical switching cell, said second bus connector bars being positioned on opposite sides of the power supply bus;
    a second AC bar having a first end coupled to the second +DC electrical switch, and a second end coupled to the second −DC electrical switch, said second AC bar having a +DC section situated in an opposing, parallel, adjacent relationship with the second +DC bus connector bar, and a −DC section situated in an opposing, parallel, adjacent relationship with the second −DC bus connector bar so that the current flow through each section of the second AC bar opposes the current flow through the adjacent DC bus connector bar; and,
    a dielectric layer positioned between the adjacent sections of the second AC bar and the second DC bus connector bars.

14. The power bus assembly as claimed in claim 13, further comprising a main bus including:
    the power supply bus;
    a first AC extension bar coupled to the first AC bar, said first AC extension bar being positioned in an adjacent, parallel relationship with the power supply bus, and also comprising a dielectric layer positioned between the power supply bus and said first AC extension bar; and,
    second AC extension bar coupled to the second AC bar, said second AC extension bar being positioned in an adjacent, parallel relationship with the power supply bus, and also comprising a dielectric layer positioned between said second AC extension bar and the bar on the main bus that is proximate thereto.

15. The power bus assembly as claimed in claim 13, further comprising:
    a third +DC bus connector bar for connecting the +DC bus bar to a third +DC electrical switching cell, and a third −DC bus connector bar for connecting the −DC bus bar to third −DC electrical switching cell, said third bus connector bars being positioned on opposite sides of the power supply bus;
    a third AC bar having a first end coupled to the third +DC electrical switch, and a second end coupled to the third −DC electrical switch, said third AC bar having a +DC section situated in an opposing, parallel, adjacent relationship with the third +DC bus connector bar, and a −DC section situated in an opposing, parallel, adjacent relationship with the third −DC bus connector bar so that the current flow through each section of the third AC bar opposes the current flow through the adjacent DC bus connector bar; and,
    a dielectric layer positioned between the adjacent sections of the third AC bar and the third DC bus connector bars.

16. The power bus assembly as claimed in claim 15, further comprising a main bus including:
    the power supply bus;
    a first AC extension bar coupled to the first AC bar, said first AC extension bar being positioned in an adjacent, parallel relationship with the power supply bus, and also comprising a dielectric layer positioned between the power supply bus and said first AC extension bar;
    second AC extension bar coupled to the second AC bar, said second AC extension bar being positioned in an adjacent, parallel relationship with the power supply bus, and also comprising a dielectric layer positioned between said second AC extension bar and the bar on the main bus that is adjacent thereto; and,
    a third AC extension bar coupled to the third AC bar, said third AC extension bar being positioned in an adjacent, parallel relationship with the power supply bus, and also comprising a dielectric layer positioned between said third AC extension bar and the bar on the main bus that is adjacent thereto.

17. A low-noise power inverter for converting electrical energy between electrical energy at a substantially constant voltage and three phase AC electrical energy by high speed switching, said low-noise power inverter comprising:
    a power supply bus for conducting current from the voltage source, said power supply bus including a pair of parallel bus bars including a +DC bus bar and a −DC bus bar, positioned in an adjacent relationship so that their flows of current are in respectively opposing directions, and further including a dielectric positioned between the bus bars of the power supply bus;

a plurality of pairs of switching cells, each cell including a first switching cell and a second switching cell; and, a plurality of branch buses for connecting the power supply bus with the plurality of switching cells and providing an output therefrom, said branch buses positioned along the length of the power supply bus, each branch bus including
  a first bus connector bar connecting the power supply bus with a first switching cell of a selected pair of switching cells,
  a second bus connector bar connecting the power supply bus with a second switching cell of said selected pair of switching cells,
  an AC bar for supplying an output from the first and second switching cells, said AC bar coupled to the first and second switching cells, said AC bar being situated in an opposing, parallel, adjacent relationship with the first and second DC bus connector bars so that the current flow through the first DC bus connector bar and a section of the AC bar adjacent thereto is substantially balanced, and the current flow through the second DC bus connector bar and a section of the AC bar adjacent thereto is substantially balanced, and,
  a dielectric positioned between each AC bar and the DC bus connector bar adjacent thereto.

18. The power inverter as claimed in claim 17, wherein the three phases of the three-phase electrical energy are defined by a phase A, a phase B, and phase C, and wherein the plurality of AC bars includes a phase A bar, a phase B bar, and a phase C bar.

19. The power inverter as claimed in claim 18, wherein the switching cells include a phase A switch pair coupled to the phase A bar, a phase B switch pair coupled to the phase B bar, and a phase C switch pair coupled to the phase C bar.

20. The power inverter as claimed in claim 19, wherein:
  the power supply bus includes a +DC bus bar and a −DC bus bar having flat opposing surfaces;
  for each branch bus in said plurality of branch buses, the first bus connector bar and an adjacent portion of the AC bar have flat, opposing surfaces, and the second bus connector bar and an adjacent portion of the AC bar have flat opposing surfaces.

21. The power inverter as claimed in claim 20, wherein for each pair of switches, the first switch is positioned on the side of the power supply bus corresponding to the +DC bus bar, and the second switch is positioned on the other side of the power supply bus, the side corresponding to the −DC bus bar.

22. The power inverter as claimed in claim 17, further comprising a plurality of extension bars, including:
  a phase A extension bar coupled to the phase A bar;
  a phase B extension bar coupled to the phase B bar; and,
  a phase C extension bar coupled to the phase C bar;
  wherein said extension bars are positioned so that they parallel the power supply bus and are adjacent therewith, and so that the flows of current within said extension bars and said power supply bus are substantially balanced at all points in the bus structure.

23. The power inverter as claimed in claim 22, wherein the power supply bus and the adjacent extension bars have flat, opposing surfaces, and the power inverter further comprises a plurality of dielectric layers positioned between the adjacent parallel extension bars and the DC bus bars.

24. The power inverter as claimed in claim 17, wherein the DC bus bars, the bus connector bars, and AC bars have a cross-sectional size suitable to conduct current for power electronics uses.

25. The power inverter as claimed in claim 24, wherein each switching cell comprises at least one high power transistor.

26. The power inverter as claimed in claim 25, wherein each switching cell comprises a pair of high power transistors.

* * * * *